(12) United States Patent
Kuo et al.

(10) Patent No.: US 12,706,251 B2
(45) Date of Patent: Aug. 11, 2026

(54) SEMICONDUCTOR DEVICE WITH ADVANCED PAD STRUCTURE AND METHOD FOR FORMING SAME

(71) Applicant: Taiwan Semiconductor Manufacturing Company, Ltd., Hsin-Chu (TW)

(72) Inventors: Fu-Chiang Kuo, Hsinchu City (TW); Yu-Hsin Fang, Kaohsiung City (TW); Hsin-Liang Chen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 564 days.

(21) Appl. No.: 18/187,909

(22) Filed: Mar. 22, 2023

(65) Prior Publication Data

US 2024/0153897 A1 May 9, 2024

Related U.S. Application Data

(60) Provisional application No. 63/382,327, filed on Nov. 4, 2022.

(51) Int. Cl.
*H01G 4/33* (2006.01)
*H01G 4/232* (2006.01)
(Continued)

(52) U.S. Cl.
CPC ............... *H01G 4/33* (2013.01); *H01G 4/232* (2013.01); *H10D 1/042* (2025.01); *H10D 1/716* (2025.01);
(Continued)

(58) Field of Classification Search
CPC ....... H01L 24/06; H01L 23/481; H01G 4/232; H01G 4/33; H10D 1/042; H10D 1/716; H10W 20/20
See application file for complete search history.

(56) References Cited

U.S. PATENT DOCUMENTS 8,836,146 B2 * 9/2014 Chou .................... H10W 72/20 257/E23.021
8,866,260 B2 * 10/2014 Shieh .................... H10W 72/90 257/532

(Continued)

FOREIGN PATENT DOCUMENTS

CN 1723556 A 1/2006
CN 103094068 A * 5/2013

(Continued)

*Primary Examiner* — Laura M Menz
(74) *Attorney, Agent, or Firm* — HAYNES AND BOONE, LLP

(57) ABSTRACT

A method of forming a semiconductor device according to the present disclosure includes forming a metal-insulator-metal (MIM) structure in a substrate and forming an interconnect structure over the substrate. The MIM structure includes first electrodes of a first polarity and second electrodes of a second polarity. The interconnect structure includes conductive paths electrically connecting to the first and second electrodes. The conductive paths are isolated from each other inside the interconnect structure. The method also includes forming first and second contact pads over the interconnect structure. The first contact pad electrically connects a first portion of the conductive paths corresponding to the first electrodes. The second contact pad electrically connects a second portion of the conductive paths corresponding to the second electrodes.

20 Claims, 20 Drawing Sheets

(51) Int. Cl.

| | |
|---|---|
| ***H10D 1/00*** | (2025.01) |
| ***H10D 1/68*** | (2025.01) |
| ***H10W 20/20*** | (2026.01) |
| *H10W 70/05* | (2026.01) |
| *H10W 70/65* | (2026.01) |
| *H10W 70/652* | (2026.01) |
| *H10W 70/654* | (2026.01) |
| *H10W 72/20* | (2026.01) |
| *H10W 72/90* | (2026.01) |
| *H10W 90/00* | (2026.01) |

(52) U.S. Cl.

CPC ............ *H10W 20/20* (2026.01); *H10W 70/05* (2026.01); *H10W 70/65* (2026.01); *H10W 70/652* (2026.01); *H10W 70/654* (2026.01); *H10W 72/227* (2026.01); *H10W 72/242* (2026.01); *H10W 72/248* (2026.01); *H10W 72/252* (2026.01); *H10W 72/922* (2026.01); *H10W 72/923* (2026.01); *H10W 72/926* (2026.01); *H10W 72/9415* (2026.01); *H10W 72/942* (2026.01); *H10W 72/944* (2026.01); *H10W 72/952* (2026.01); *H10W 72/957* (2026.01); *H10W 90/724* (2026.01)

(56) References Cited

U.S. PATENT DOCUMENTS

| | | | | |
|---|---|---|---|---|
| 9,401,353 | B2 * | 7/2016 | Ramachandran .... | H10D 89/911 |
| 9,666,545 | B2 | 5/2017 | Wang et al. | |
| 10,164,005 | B2 * | 12/2018 | Tsui ...................... | H10D 1/716 |
| 10,269,894 | B1 * | 4/2019 | Tsui ...................... | H10D 1/716 |
| 10,693,019 | B2 * | 6/2020 | Cheng .................... | H10D 1/042 |
| 11,018,169 | B2 * | 5/2021 | Huang ................ | H10F 39/8023 |
| 11,201,205 | B2 * | 12/2021 | Tsai ...................... | H10D 1/692 |
| 11,211,362 | B2 * | 12/2021 | Huang ................... | H10D 1/716 |
| 11,574,940 | B2 * | 2/2023 | Huang .................... | H10F 39/18 |
| 11,735,624 | B2 * | 8/2023 | Kalnitsky .............. | H10D 1/042<br>257/534 |
| 11,784,172 | B2 * | 10/2023 | Yu ......................... | H10W 90/00<br>257/532 |
| 11,817,510 | B2 * | 11/2023 | Kuo ....................... | H10D 1/042 |
| 11,854,928 | B2 * | 12/2023 | Wang ..................... | H10D 1/665 |
| 11,862,612 | B2 * | 1/2024 | Huang ................... | H10D 1/716 |
| 11,961,878 | B2 * | 4/2024 | Tsai ...................... | H10D 1/692 |
| 12,021,113 | B2 * | 6/2024 | Lin ........................ | H10D 1/692 |
| 12,068,295 | B2 * | 8/2024 | Yu ......................... | H10W 90/00 |
| 12,119,414 | B2 * | 10/2024 | Kuo ....................... | H10D 1/042 |
| 12,218,184 | B2 * | 2/2025 | Chu ....................... | H10D 1/692 |
| 12,249,590 | B2 * | 3/2025 | Chang ................... | H10W 90/00 |
| 12,334,475 | B2 * | 6/2025 | Huang ................... | H10D 1/716 |
| 12,432,942 | B2 * | 9/2025 | Lin ........................ | H10D 1/042 |
| 12,446,240 | B2 * | 10/2025 | Tsai ...................... | H10D 1/692 |
| 2010/0219502 | A1 * | 9/2010 | Shieh .................... | H10W 72/90<br>257/532 |
| 2011/0233726 | A1 * | 9/2011 | Huang ................ | H10W 74/117<br>257/532 |
| 2012/0080771 | A1 * | 4/2012 | Yang ................... | H10W 20/496<br>257/532 |
| 2014/0217549 | A1 * | 8/2014 | Tzeng ...................... | H10D 1/68<br>257/532 |
| 2014/0235019 | A1 * | 8/2014 | Tzeng ...................... | H10D 1/68<br>438/126 |
| 2016/0043068 | A1 * | 2/2016 | Ramachandran .... | H10D 89/911<br>257/532 |
| 2016/0095221 | A1 * | 3/2016 | Ramachandran ...... | H05K 1/181<br>361/783 |
| 2017/0271436 | A1 * | 9/2017 | Tsui ...................... | H10D 1/716 |
| 2018/0122781 | A1 | 5/2018 | Chen et al. | |
| 2019/0074349 | A1 * | 3/2019 | Lin ....................... | H10D 1/042 |
| 2019/0148481 | A1 * | 5/2019 | Tsui ...................... | H10D 1/716<br>257/532 |
| 2020/0066922 | A1 * | 2/2020 | Cheng .................... | H10D 1/042 |
| 2021/0036097 | A1 * | 2/2021 | Tsai ...................... | H10D 1/692 |
| 2021/0057469 | A1 * | 2/2021 | Huang ................... | H10D 1/043 |
| 2021/0104598 | A1 * | 4/2021 | Lin ....................... | H10D 1/042 |
| 2021/0159187 | A1 | 5/2021 | Hsieh et al. | |
| 2021/0217691 | A1 * | 7/2021 | Chen ................... | H10W 70/685 |
| 2021/0272991 | A1 * | 9/2021 | Huang .................... | H10F 39/18 |
| 2021/0296283 | A1 * | 9/2021 | Huang ................... | H10D 1/716 |
| 2021/0305164 | A1 | 9/2021 | Tseng et al. | |
| 2022/0102482 | A1 * | 3/2022 | Tsai ...................... | H10D 1/692 |
| 2022/0115358 | A1 * | 4/2022 | Huang ................... | H10D 1/716 |
| 2022/0189919 | A1 * | 6/2022 | Jeng ...................... | H10W 70/09 |
| 2022/0199759 | A1 * | 6/2022 | Chyi Liu ............... | H10D 1/696 |
| 2022/0238430 | A1 * | 7/2022 | Chen ........................ | H01G 2/06 |
| 2022/0262778 | A1 * | 8/2022 | Yu ......................... | H10W 90/00 |
| 2022/0285480 | A1 * | 9/2022 | Kalnitsky .............. | H10D 1/042 |
| 2022/0367406 | A1 * | 11/2022 | Chang ................... | H10W 90/00 |
| 2023/0009279 | A1 * | 1/2023 | Kuo ................... | H10B 12/0387 |
| 2023/0062136 | A1 * | 3/2023 | Wang ..................... | H10D 1/665 |
| 2023/0068481 | A1 * | 3/2023 | Kuo ....................... | H10D 1/042 |
| 2023/0123774 | A1 * | 4/2023 | Lin ....................... | H10D 1/692<br>257/532 |
| 2023/0307558 | A1 * | 9/2023 | Kuo ....................... | H10D 1/042 |
| 2023/0369302 | A1 * | 11/2023 | Yu ......................... | H10W 90/00 |
| 2023/0387189 | A1 * | 11/2023 | Chu ....................... | H10D 1/692 |
| 2023/0420493 | A1 * | 12/2023 | Lin ....................... | H10D 1/042 |
| 2024/0079353 | A1 * | 3/2024 | Kuo ....................... | H10D 1/696 |
| 2024/0088103 | A1 * | 3/2024 | Huang ................... | H10D 1/716 |
| 2024/0105707 | A1 * | 3/2024 | Kuo ....................... | H10D 86/85 |
| 2024/0153897 | A1 * | 5/2024 | Kuo ........................ | H01G 4/33 |
| 2024/0194730 | A1 * | 6/2024 | Tsai ...................... | H10D 1/692 |
| 2024/0304659 | A1 * | 9/2024 | Lin ....................... | H10D 1/692 |
| 2024/0321858 | A1 * | 9/2024 | Wang ..................... | H10D 86/85 |
| 2024/0355799 | A1 * | 10/2024 | Yu ......................... | H10W 90/00 |
| 2024/0372014 | A1 * | 11/2024 | Kuo ....................... | H10D 1/042 |
| 2025/0142847 | A1 * | 5/2025 | Chu ....................... | H10D 1/692 |
| 2025/0210583 | A1 * | 6/2025 | Chang ................... | H10W 90/00 |
| 2025/0253268 | A1 * | 8/2025 | Waldemer .............. | H10D 1/692 |
| 2025/0273632 | A1 * | 8/2025 | Huang ................... | H10D 1/716 |

FOREIGN PATENT DOCUMENTS

| | | | | | |
|---|---|---|---|---|---|
| CN | 103094068 | B | * | 11/2015 | |
| CN | 113053855 | A | * | 6/2021 | ............ H10W 90/00 |
| CN | 114664786 | A | * | 6/2022 | .......... H10W 20/496 |
| CN | 221057422 | U | * | 5/2024 | ............ H10W 20/20 |
| DE | 102021006199 | A1 | * | 3/2022 | .......... H10W 20/496 |
| DE | 102021110267 | A1 | * | 8/2022 | ........ H10W 20/0245 |
| DE | 102020108145 | B4 | * | 11/2022 | ............ H10W 80/00 |
| DE | 102022101393 | A1 | * | 4/2023 | ............. H10D 84/80 |
| DE | 102022101393 | B4 | * | 4/2023 | ............. H10D 84/80 |
| DE | 102022004994 | A1 | * | 6/2023 | ............. H10D 84/80 |
| DE | 102022004994 | B4 | * | 3/2024 | ............. H10D 84/80 |
| KR | 20220115845 | A | * | 8/2022 | ........ H10W 20/0245 |
| KR | 20230053487 | A | * | 4/2023 | ............. H10D 84/80 |
| KR | 102649180 | B1 | * | 3/2024 | ........ H10W 20/0245 |
| TW | 200919684 | A | | 5/2009 | |
| TW | 202109901 | A | | 3/2021 | |
| TW | 202137574 | A | | 10/2021 | |
| WO | WO-2016048753 | A1 | * | 3/2016 | ............ H10W 90/00 |

* cited by examiner 206
208A
202
208B
208C
208D
212
214
210D
210C
210B
210A
200
216

SEMICONDUCTOR DEVICE WITH ADVANCED PAD STRUCTURE AND METHOD FOR FORMING SAME

PRIORITY DATA

This application claims priority to U.S. Provisional Patent Application No. 63/382,327 filed on Nov. 4, 2022, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As the IC industry continues to improve the integration density of various electronic components (e.g., capacitors, diodes, transistors, resistors, etc.) by continual reductions in minimum feature sizes, additional problems arise within each of the processes that are used, and these additional problems should be addressed. For example, semiconductor devices include one or numerous conductive metal layers. The conductive metal layers serve as wiring layers and couple the various electronic components to one another through dielectric materials. The conductive metal layers are formed over one another and at various device levels. Each semiconductor device includes an uppermost, top metal wiring layer. The top metal wiring layer of the semiconductor device must be coupled to a solder bump or other external component as part of the assembly process and in order for the semiconductor device to be utilized. Lengthy metal wiring may cause plasma damage to the semiconductor device. The plasma can charge the dielectric materials formed over the metal wiring, through an antenna-type effect, and propagate through the metal layers and to capacitors, diodes, transistors, resistors, and other features (e.g., conductive vias) formed on the substrate or between the metal layers. When this charge undesirably reaches vulnerable features formed in the semiconductor device, this charge can cause blowout and destruction of the functionality of the vulnerable features and of the entire semiconductor device. Therefore, while existing processes and structures of semiconductor devices may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
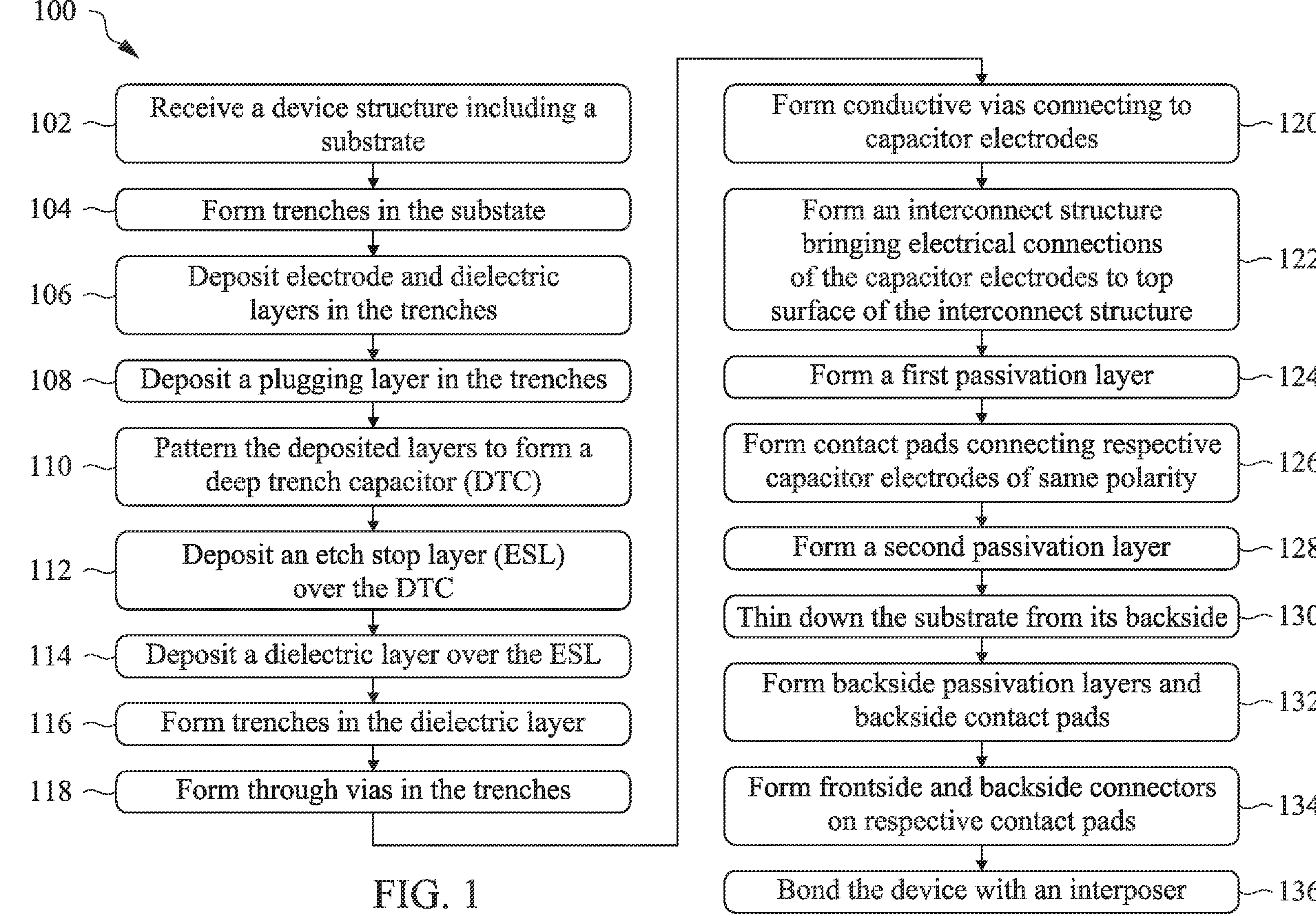
FIG. 1 illustrates a flow chart of a method for forming a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure relates generally to manufacturing semiconductor devices, and more particularly, to manufacturing a connective structure for coupling electronic components to solder balls or bonding wires. Embodiments will be described with respect to an interconnect structure of a semiconductor device that brings electrical connection of lower metal wirings until at contact pad level without connecting lower metal wirings locally. This configuration isolates lower metal wires and avoids forming lengthy metal wires suspended above electronic components, which may easily cause interconnect failure due to antenna-type effect and plasma arcing. A type of such interconnect failure that often occurs during semiconductor manufacturing is via-induced metal-island corrosion (VIMIC). Various embodiments discussed herein allow for avoiding burn-out and circuit short of various components of a semiconductor device due to plasma arcing, including VIMIC. In some illustrated embodiments, the semiconductor device may be an integrated passive device (IPD) comprising metal-insulator-metal (MIM) structure, such as deep trench capacitors (DTCs). However, embodiments discussed herein may also be applied to other semiconductor devices, such as planar CMOS devices, FinFET devices, gate-all-around (GAA) devices, or the like.

Illustrated in FIG. 1 is a method 100 of semiconductor fabrication including fabrication of a semiconductor device comprising deep trench capacitors (DTCs). The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2-21F, which represent cross-sectional views of an embodiment of a memory device according to various stages of the method 100, in accordance with some embodiments of the present disclosure.

Figures 2, 3:
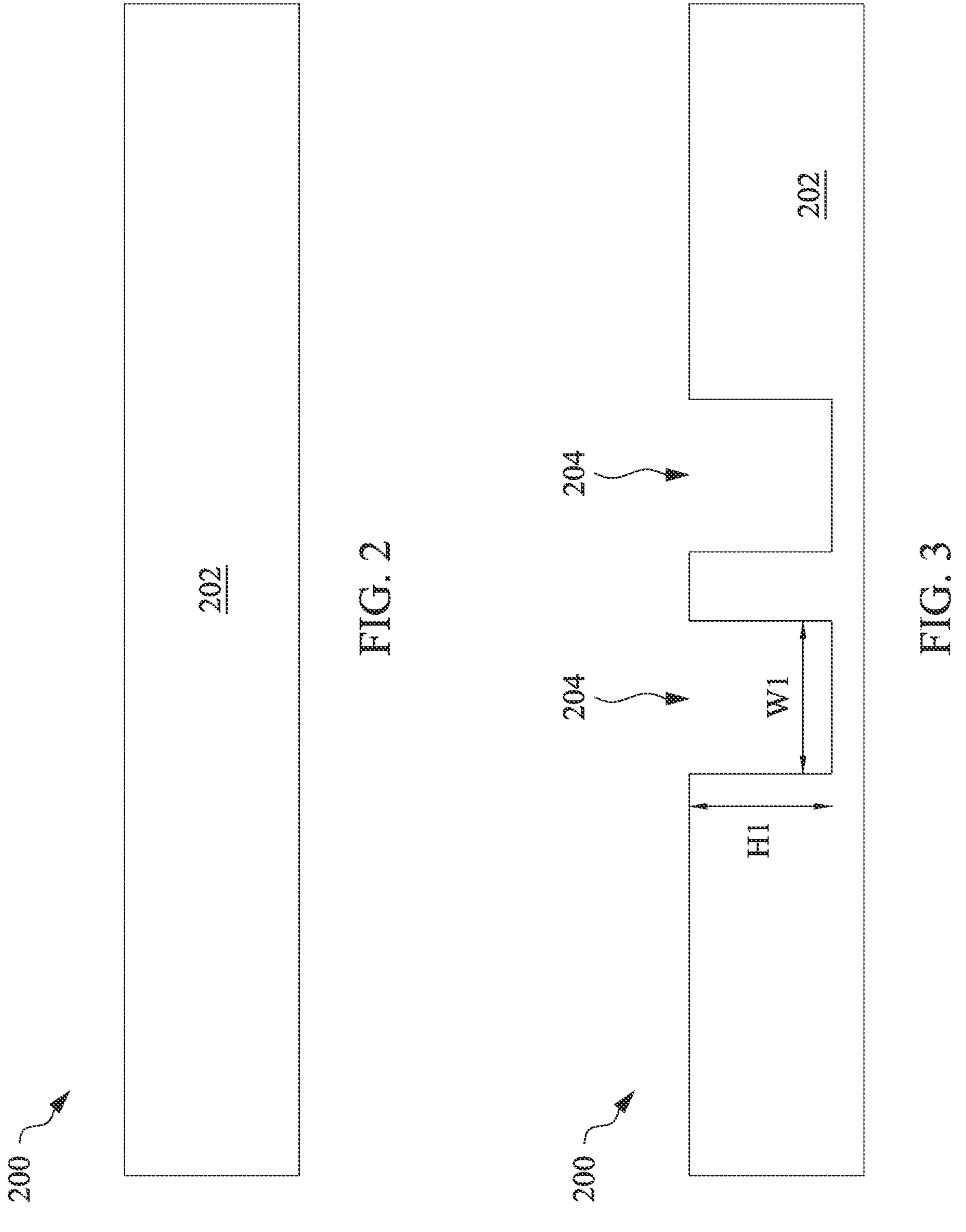
FIGS. 2, 3, 4, 5, 6, 7, 8, 9, 10, 11, 12, 13, 14, 15, 16A, 16B, 16C, 17, 18, 19, and 20 illustrate cross-sectional views of a semiconductor device during a fabrication process according to the method of FIG. 1, according to various aspects of the present disclosure.

The method 100 at operation 102 (FIG. 1) provides (or is provided with) a semiconductor device (or device) 200 that includes a substrate 202, such as shown in FIG. 2. The device 200 may be a portion of an IC chip, a system on chip (SoC), or portion thereof, which may include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof.

The substrate 202 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 202 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

The method 100 at operation 104 (FIG. 1) forms trenches 204 (illustrated by two trenches) in the substrate 202, such as shown in FIG. 3. In some embodiments, the substrate 202 may be patterned using suitable photolithography and etching methods to form the trenches 204. For example, a photoresist (not shown) may be formed and patterned over the substrate 202, and one or more etching processes, such as a dry etch process, may be utilized to remove those exposed portions of the substrate 202. In some embodiments, the dry etch process includes a reactive ion etch (RIE) adopting fluorine-containing gases. The photoresist is removed after the trenches 204 are formed. In some embodiments, the trenches 204 may have a width W1 between about 0.1 um and about 5 μm. In some embodiments, the trenches 204 may have a depth H1 between about 0.5 um and about 50 μm. In some embodiments, a ratio H1/W1 is between about 0.1 and about 500. As described below in greater detail, a type of metal-insulator-metal (MIM) structure, particularly a deep trench capacitor (DTC) is formed in the trenches 204. Those skilled in the art should recognize electronic components other than MIM structures are also fully intended to be included within the scope of the embodiments.

Figure 4:
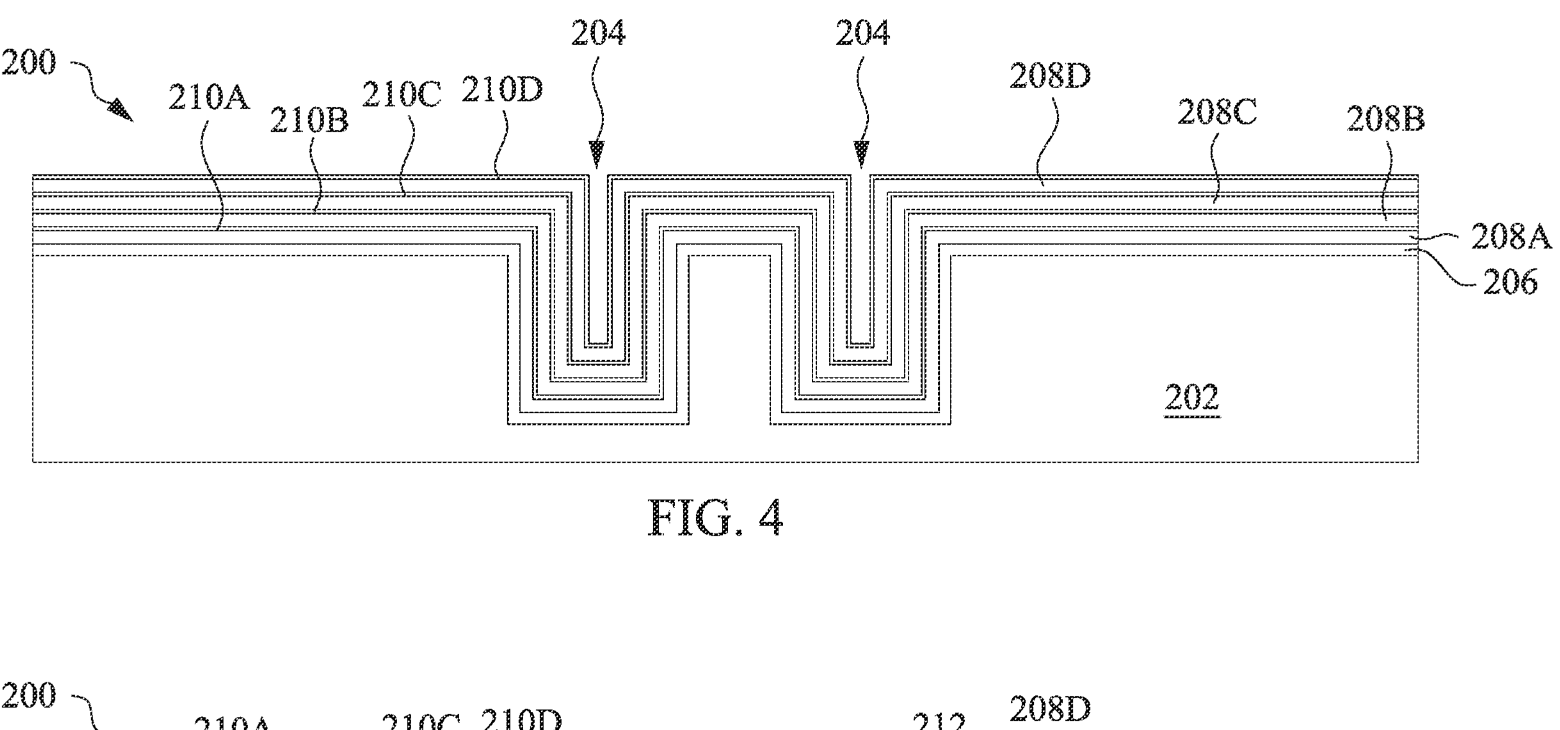

The method 100 at operation 106 (FIG. 1) deposits various material layers over the substrate 202 and along sidewalls and a bottom surface of the trenches 204, such as shown in FIG. 4. The material layers will be patterned in forming a DTC in subsequent processes. Each of the material layers may be blanket deposited to have substantially uniform thickness on various surfaces of the device 200. In the illustrated embodiment, a liner layer 206 is formed over the substrate 202 and along sidewalls and the bottom surface of the trenches 204. In some embodiments, the liner layer 206 may comprise a dielectric material, such as silicon oxide, SiON, SiCON, a combination thereof, or the like, and may be formed using atomic layer deposition (ALD), chemical vapor deposition (CVD), a combination thereof, or the like. In some embodiments, the liner layer 206 has a thickness between about 5 nm and about 100 nm.

In some embodiments, after forming the liner layer 206, conductive layers 208A-208D and dielectric layers 210A-210D are formed in the trenches 204 in an alternating manner. The conductive layers 208A-208D may be also referred to as capacitor electrodes 208A-208D. In some embodiments, each of the conductive layers 208A-208D may comprise a conductive material such as doped silicon, polysilicon, copper, tungsten, an aluminum or copper alloy, titanium, titanium nitride, tantalum, tantalum nitride, a combination thereof, or the like, and may be formed using plating, physical vapor deposition (PVD), ALD, CVD, a combination thereof, or the like. In some embodiments, each of the conductive layers 208A-208D has a thickness between about 10 nm and about 100 nm. In some embodiments, each of the dielectric layer 210A-210D may comprise a high-K dielectric material such as aluminum oxide, zirconium oxide, a combination thereof, a multilayer thereof, or the like. In an embodiment, each of the dielectric layers 210A-210D comprises a multilayer including two layers of zirconium oxide and a layer of aluminum oxide interposed between the layers of zirconium oxide. In some embodiments, each of the dielectric layers 210A-210D has a thickness between about 0.3 nm and about 10 nm.

Figure 5:
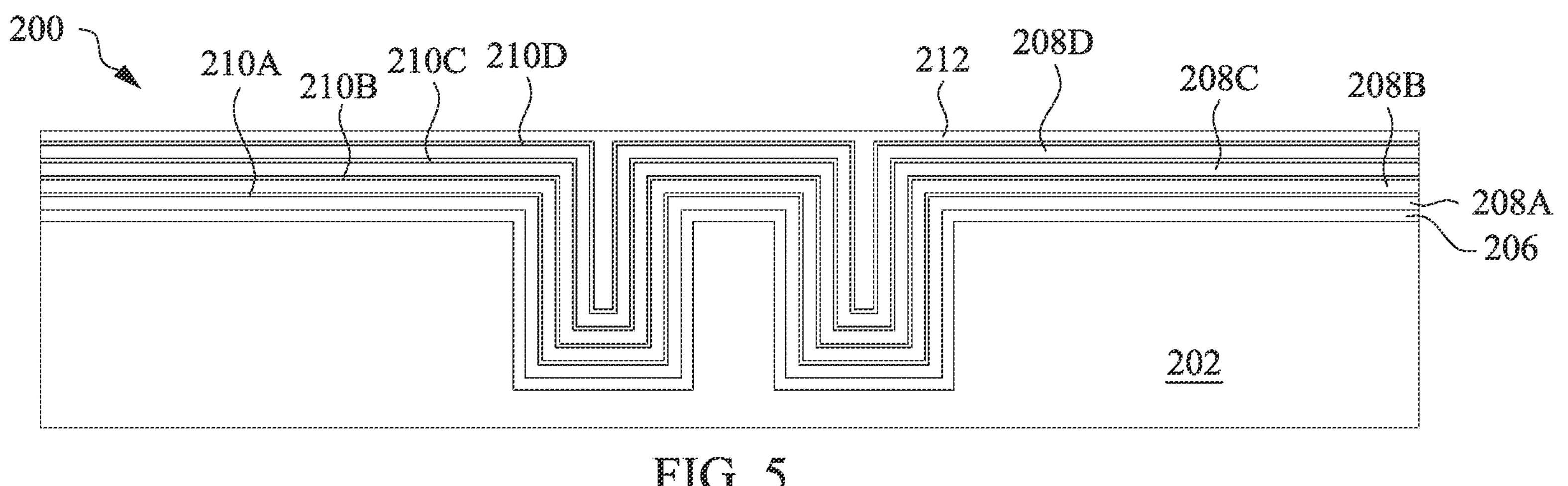

The method 100 at operation 108 (FIG. 1) deposits a plugging layer 212 that plugs remaining portion of the trenches 204, such as shown in FIG. 5. In some embodiments, the plugging layer 212 includes a dielectric material such as silicon oxide, silicon nitride, a combination thereof, a multilayer thereof, or the like. In some embodiments, the plugging layer 212 includes a high-K dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-K dielectric materials, a combination thereof, a multilayer thereof, or the like. In some embodiments, the plugging layer 212 includes a semiconductor material such as polysilicon. The plugging layer 212 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof. At the conclusion of operation 108, a planarization process, such as a chemical mechanical polishing (CMP) process, is performed to remove an excess portion of the plugging layer 212.

Figures 6, 7:
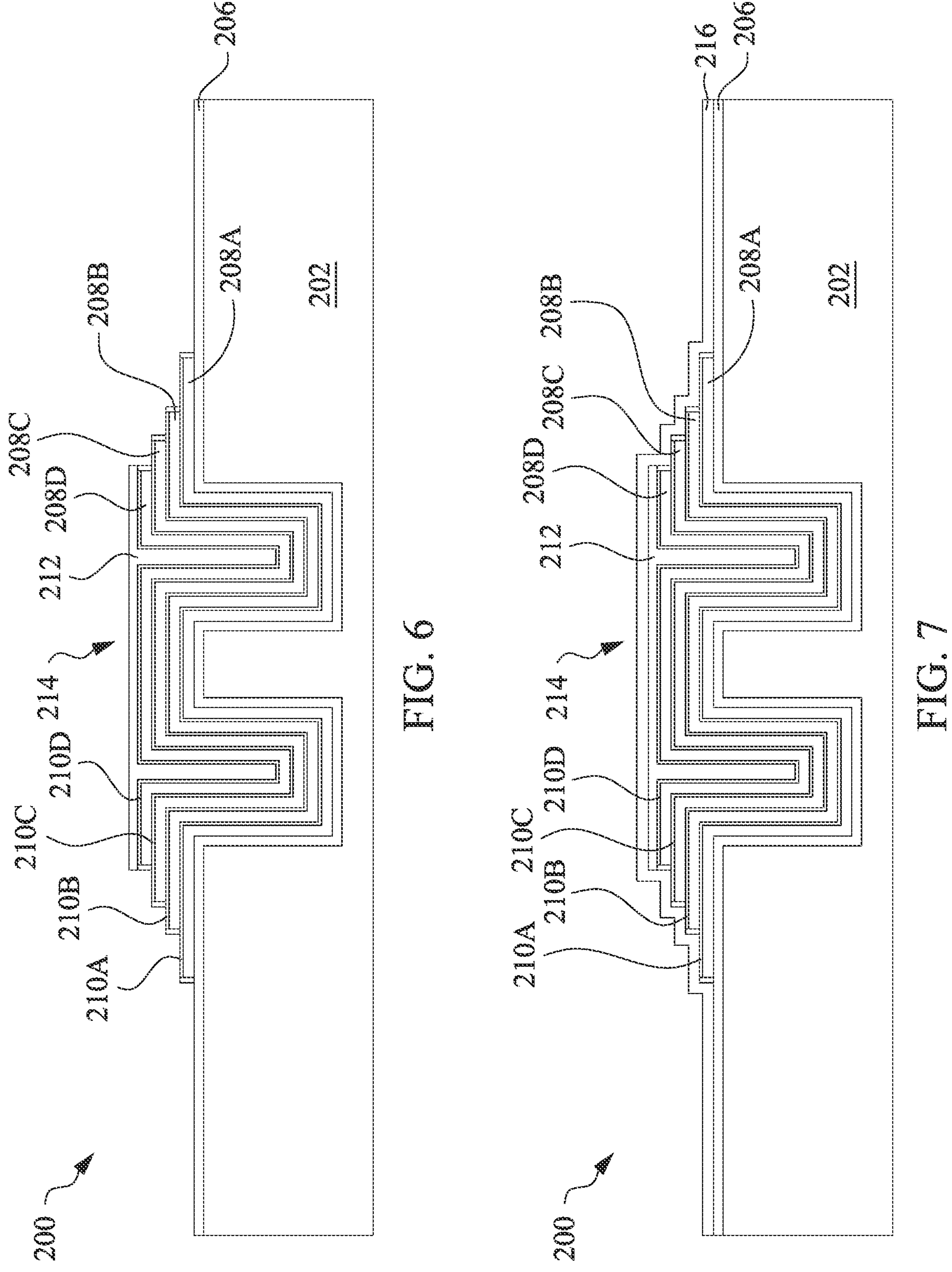

The method 100 at operation 110 (FIG. 1) patterns the conductive layers 208A-208D, dielectric layers 210A-210D, and the plugging layer 212 to form a DTC 214, such as shown in FIG. 6. In some embodiments, the plugging layer 212, the dielectric layer 210D, and the conductive layer 208D are patterned to expose portions of a top surface of the dielectric layer 210C and sidewalls of the conductive layer 208D. The patterning processes may comprise suitable photolithography and etching methods, such as dry etching, wet etching, RIE, and/or other suitable processes. The dielectric layer 210C and the conductive layer 208C are patterned to expose portions of a top surface of the dielectric layer 210B and sidewalls of the conductive layer 208C. The patterning processes may comprise suitable photolithography and etching methods. The dielectric layer 210B and the conductive layer 208B are patterned to expose portions of a top surface of the dielectric layer 210A and sidewalls of the conductive layer 208B. The patterning processes may comprise suitable photolithography and etching methods. The dielectric layer 210A and the conductive layer 208A are patterned to expose portions of a top surface of the liner layer 206 and sidewalls of the conductive layer 208A. The patterning processes may comprise suitable photolithography and etching methods. Optionally, the liner layer 206 may be also patterned to expose the substrate 202. In the illustrated embodiment, the liner layer 206 remains covering the substrate 202.

At the conclusion of operation 110, the DTC 214 is formed. In the embodiment illustrated in FIG. 6, the DTC 214 comprises four capacitor electrodes. In other embodiments, the DTC 214 may comprise more or less than four capacitor electrodes based on design requirements for a DTC. Further, in the illustrated embodiment, the layers in a single DTC 214 extend continuously across two adjacent trenches 204. That is, a single DTC 214 occupies two adjacent trenches 204. In other embodiments, a single DTC 214 may occupy a single trench 204 or more than two trenches 204. As one of ordinary skill in the art will recognize, the above-described process for forming DTCs is merely one method of forming DTCs, and other methods are also fully intended to be included within the scope of the embodiments.

The method 100 at operation 112 (FIG. 1) deposits an etch stop layer (ESL) 216 over the DTC 214 and over the liner layer 206, such as shown in FIG. 7. In some embodiments, the ESL 216 may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, plasma-enhanced CVD (PECVD), ALD, a combination thereof, or the like. In some embodiments, the ESL 216 has a thickness between about 3 nm and about 30 nm. In some embodiments, the ESL 216 is used to aid in forming conductive vias that provide electrical connection to the conductive layers 208A-208D of the DTC 214. The ESL 216 may be also referred to as a contact etch stop layer (CESL).

Figures 8, 9:
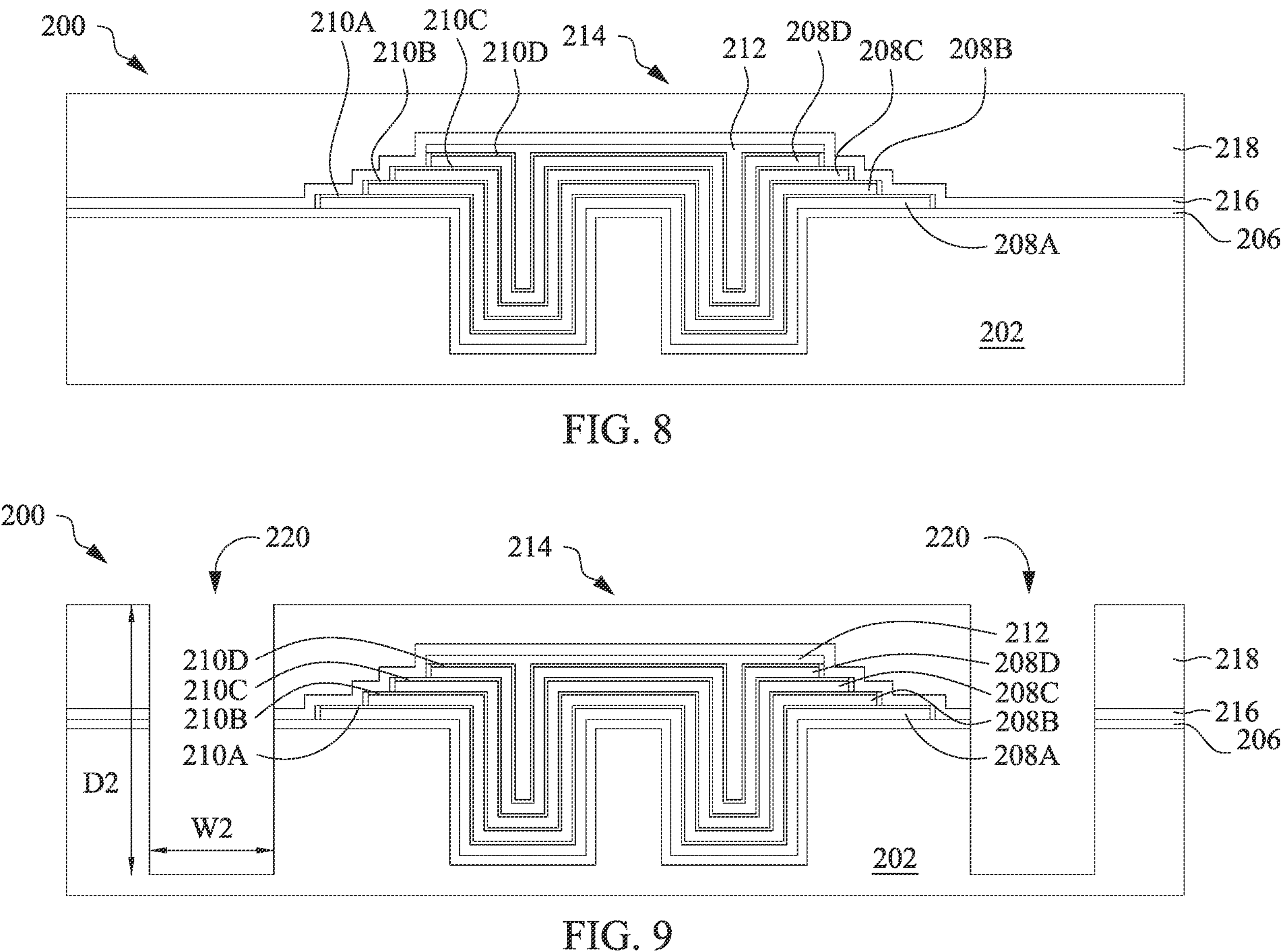

The method 100 at operation 114 (FIG. 1) forms a dielectric layer 218 over the ESL 216, such as shown in FIG. 8. The dielectric layer 218 may include a low-k dielectric material such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, and may be formed by any suitable method, such as spin-on coating, CVD, PECVD, ALD, a combination thereof, or the like.

The method 100 at operation 116 (FIG. 1) forms trenches 220 in the substrate 202, such as shown in FIG. 9. The two illustrated trenches 220 are disposed on two sides of the DTC 214. In some embodiments, the trenches 220 has a width W2 between about 0.5 um and about 50 um and a depth D2 between about 10 um and about 100 um. In some embodiments, a ratio of D2/W2 is approximately from about 0.2 to about 200. The bottom surface of the trenches 220 are below the bottom surface of the trenches 204. The trenches 220 are formed where a trench mask (not shown) is disposed over the substrate 202. The trench mask can be a photoresist mask or a hard mask, such as a nitride. Then, an etching operation is performed with the trench mask in place. The trenches 220 is formed by a suitable etching process, such as a dry etch operation. In some embodiments, the dry etch in the present operation includes a reactive ion etch (RIE) adopting fluorine-containing gases. The trench mask is removed after the trenches 220 are formed.

Figures 10, 11:
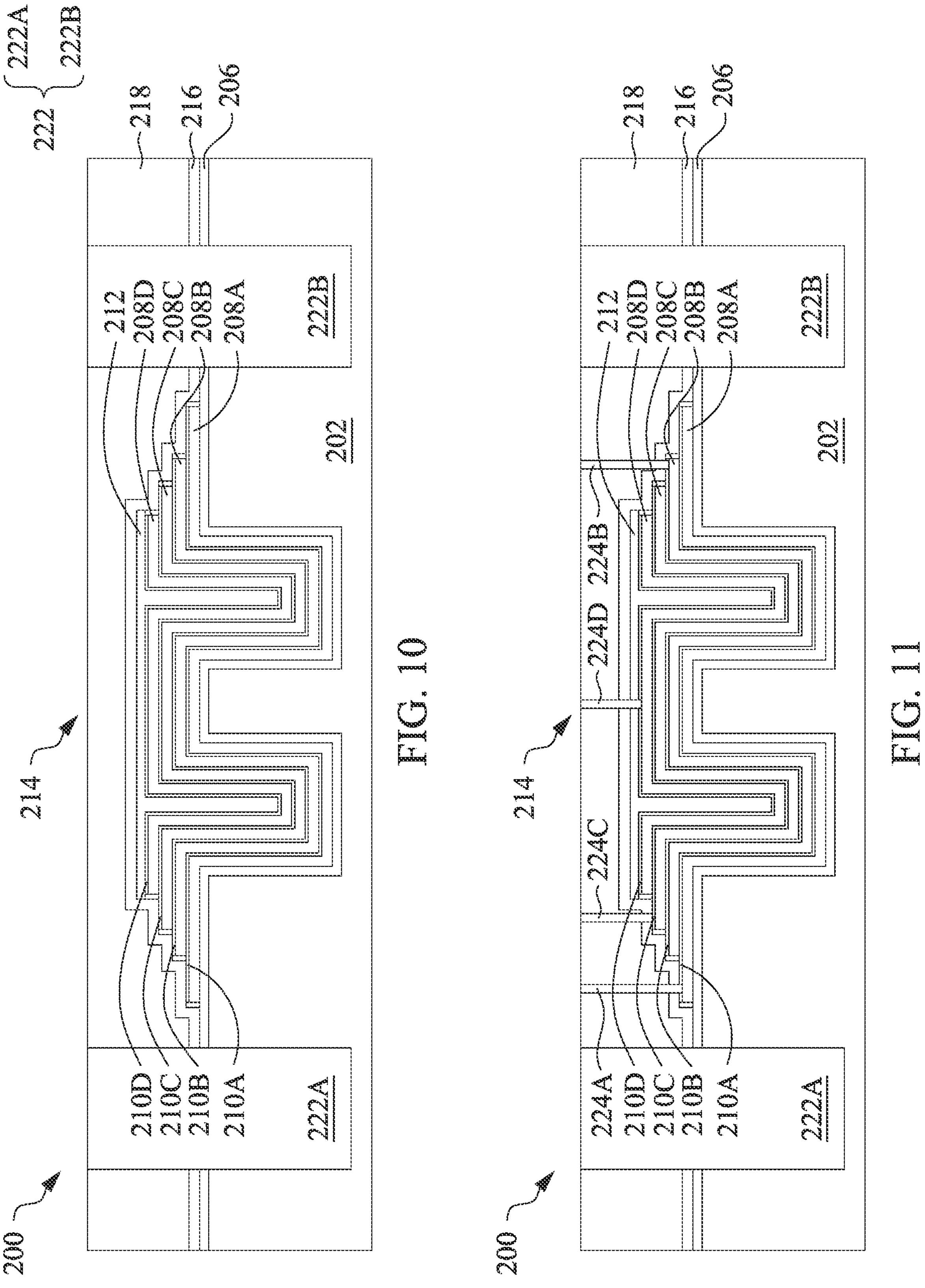

The method 100 at operation 118 (FIG. 1) fills conductive material in the trenches 220 to form through vias 222A and 222B (collectively as through vias 222), such as shown in FIG. 10. The through vias 222 are sometimes referred to as through-substrate vias or through-silicon vias (TSVs). A thin barrier layer (not shown) may be deposited over the frontside of the substrate 202 and on the sidewalls and the bottom surface of the trenches 220, such as by CVD, atomic layer deposition (ALD), physical vapor deposition (PVD), thermal oxidation, combinations thereof, and/or the like. The barrier layer may be formed from an oxide, a nitride, or an oxynitride, such as titanium nitride, titanium oxynitride, tantalum nitride, tantalum oxynitride, tungsten nitride, silicon oxide, combinations thereof, and/or the like. A conductive material may be deposited over the thin barrier layer and in the trenches 220 in forming the through vias 222. The conductive material may be formed by an electro-chemical plating process, CVD, ALD, PVD, combinations thereof, or the like. Examples of conductive materials are copper, tungsten, aluminum, silver, gold, combinations thereof, or the like. In the illustrated embodiment, the conductive material is copper. Excess conductive material and the barrier layer may be removed from the frontside of the substrate 202 using, for example, a CMP process. Thus, the through vias 222 may include a conductive material with a thin barrier layer between the conductive material and the substrate 202. The bottom surface of the through vias 222 is closer to the backside of the substrate 202 than the bottom surface of the DTC 214.

The method 100 at operation 120 (FIG. 1) forms conductive vias 224A-224D in physical contact with the capacitor electrodes 208A-208D, respectively, such as shown in FIG. 11. The conductive vias 224A-224D may be formed by forming via holes, for example, etching, milling, laser techniques, a combination thereof, or the like, and filling the via holes with a conductive material, such as titanium (Ti), ruthenium (Ru), nickel (Ni), cobalt (Co), copper (Cu), molybdenum (Mo), tungsten (W), or aluminum (Al). In the illustrated embodiment, the through vias 222 and the conductive vias 224A-224D include different conductive materials, such as copper for the through vias 222 and tungsten for the conductive vias 224A-224D, in consideration of different needs of conductivity and hole-filling capability. In some embodiments, the conductive via 224A extends through the dielectric layer 218, the ESL 216, and the dielectric layer 210A and physically contacts the capacitor electrode 208A. The conductive via 224B extends through the dielectric layer 218, the ESL 216, and the dielectric layer 210B and physically contacts the capacitor electrode 208B. The conductive via 224C extends through the dielectric layer 218, the ESL 216, and the dielectric layer 210C and physically contacts the capacitor electrode 208C. The conductive via 224D extends through the dielectric layer 218, the ESL 216, the plugging layer 212, and the dielectric layer 210D and physically contacts the capacitor electrode 208D. The conductive vias 224A-224D electrically connects the capacitor electrodes 208A-208D to interconnect structure to be formed thereabove in subsequent processes. Since the capacitor electrodes 208A and 208C are of same polarity (e.g., positive or vice versa) of the DTC 214 and the capacitor electrodes 208B and 208D are of an opposite polarity (e.g., negative or vice versa) of the DTC 214, the conductive vias 224A and 224C will be electrically connected through higher conductive layers to be formed in subsequent processes, and the conductive vias 224B and 224D will be electrically connected through higher conductive layers to be formed in subsequent processes. To simplify routing, the conductive vias 224A and 224C are disposed on same side of the DTC 214, and the conductive vias 224B and 224D are disposed on an opposing side of the DTC 214. In the illustrated embodiment, the conductive via 224D is disposed in the middle of the DTC 214, between the two trenches 204, and further penetrates the plugging layer 212 as the capacitor electrode 208D is covered by the plugging layer 212.

Figure 12:
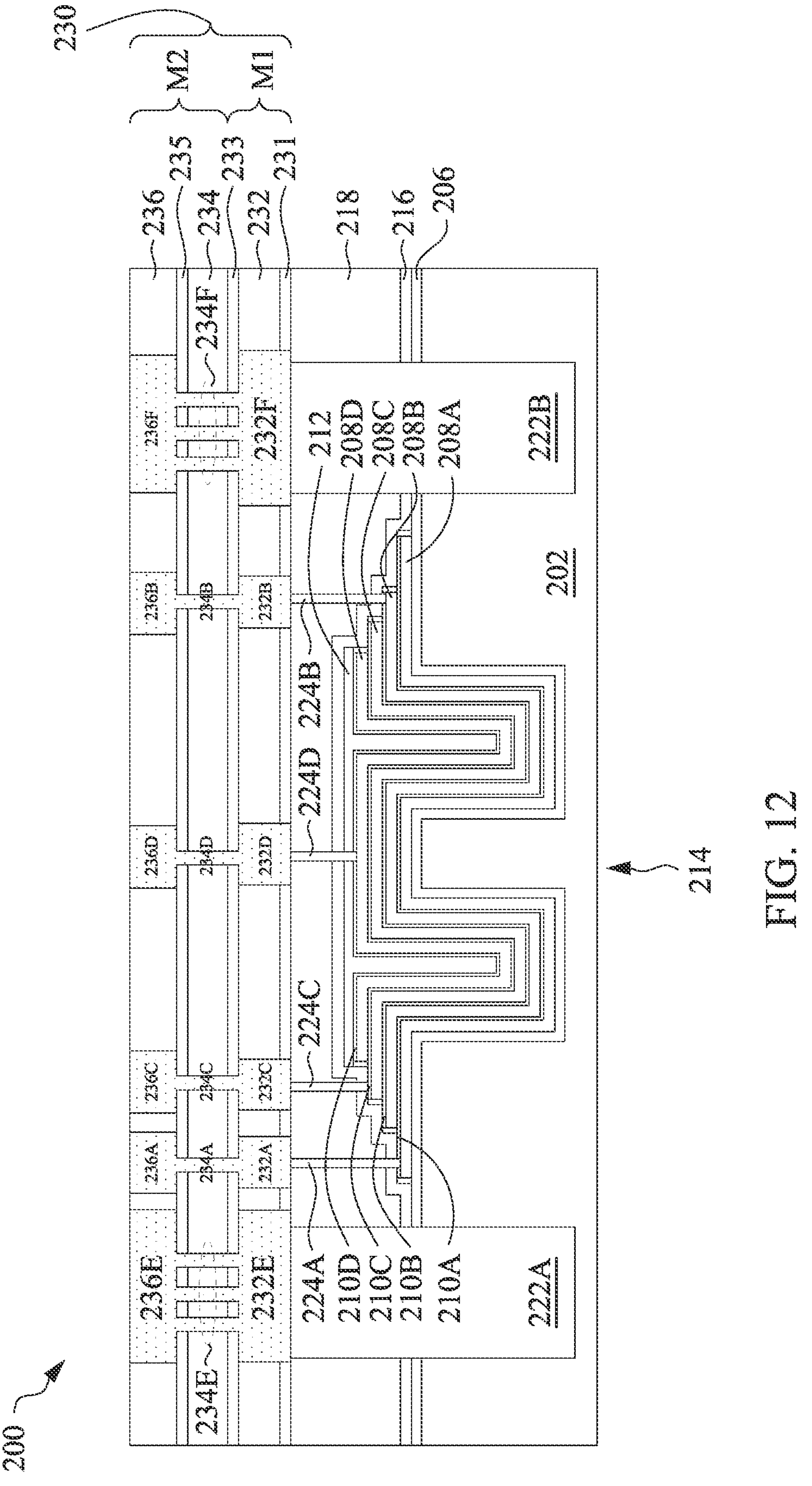

The method 100 at operation 122 (FIG. 1) forms an interconnect structure 230 over the substrate 202 and the DTC 214, such as shown in FIG. 12. In some embodiments, the interconnect structure 230 comprises a plurality of dielectric layers with conductive features embedded in the plurality of dielectric layers. In the illustrated embodiment, the interconnect structure 230 comprises a dielectric layer 232 with conductive lines 232A-232F embedded within the dielectric layer 232, a dielectric layer 234 with conductive vias 234A-234F embedded within the dielectric layer 234, and a dielectric layer 236 embedded with conductive lines 236A-236F within the dielectric layer 236. In the illustrated embodiment, the interconnect structure 230 comprises three dielectric layers with embedded conductive features. In other embodiments, the interconnect structure 230 may comprise more or less than three dielectric layers with embedded conductive features based on design requirements of the interconnect structure 230. The dielectric layer 232 with embedded conductive features may also be termed Metal 1 (M1) layer. The dielectric layers 234 and 236 with embedded conductive features may also be termed collectively as Metal 2 (M2) layer. In other embodiments, the interconnect structure 230 may comprise more or less than two metal layers, such as up to ten metal layers (M1-M10) based on design requirements of the interconnect structure 230. The interconnect structure 230 may also be termed as a multilayer interconnect structure.

In some embodiments, the dielectric layers 232, 234, and 236 may include a low-K dielectric material such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, and may be formed by any suitable method, such as spin-on coating, CVD, PECVD, ALD, a combination thereof, or the like. The conductive features (such as conductive lines 232A-232F and 236A-236F and conductive vias 234A-234F) may be formed using any suitable method, such as a damascene method, or the like. In some embodiments, the steps for forming the conductive features include forming openings in the respective dielectric layers, depositing one or more barrier/adhesion layers (not shown) in the openings, depositing seed layers (not shown) over the one or more barrier/adhesion layers, and filling the openings with a conductive material. A chemical mechanical polishing (CMP) is then performed to remove excess materials of the one or more barrier/adhesion layers, the seed layers, and the conductive material overfilling the openings. In some embodiments, the one or more barrier/adhesion layers may comprise titanium, titanium nitride, tantalum, tantalum nitride, a combination thereof, or the like, and may be formed using PVD, CVD, ALD, a combination thereof, or the like. The seed layers may comprise copper, titanium, nickel, gold, manganese, a combination thereof, or the like, and may be formed by plating, ALD, CVD, PVD, sputtering, a combination thereof, or the like. The conductive material may comprise copper, aluminum, tungsten, combinations thereof, alloys thereof, or the like, and may be formed using, for example, by plating, or other suitable methods. In the illustrated embodiment, the conductive material includes copper, which is also included in the through vias 222, but different from conductive vias 224A-224D that include tungsten instead.

In some embodiments, the interconnect structure 230 further comprises etch stop layers (ESLs) 231, 233, and 235 formed between adjacent ones of the dielectric layers 218, 232, 234, and 236. A material for the ESLs 231, 233, and 235 is chosen such that etch rates of the ESLs 231, 233, and 235 are less than etch rates of corresponding ones of the dielectric layers 232, 234, and 236. In some embodiments, an etch rate of the ESL 231 is less than an etch rate of the dielectric layer 232. In some embodiments, an etch rate of the ESL 233 is less than an etch rate of the dielectric layer 234. In some embodiments, an etch rate of the ESL 235 is less than an etch rate of the dielectric layer 236. In some embodiments, each of the ESLs 231, 233, and 235 may comprise similar material as the ESL 216 described above with reference to FIG. 7 and the description is not repeated herein for the sake of simplicity.

In the illustrated embodiment, the conductive line 232E contacts the through via 222A, a plurality of conductive vias 234E contacts the conductive line 232E, and the conductive line 236E contacts the plurality of conductive vias 234E. The path of the conductive line 232E, the plurality of conductive vias 234E, and the conductive line 236E electrically couples the through via 222A to the top surface of the interconnect structure 230. Similarly, the path of the conductive line 232F, the plurality of conductive vias 234F, and the conductive line 236F electrically couples the through via 222B to the top surface of the interconnect structure 230.

In the illustrated embodiment, the conductive via 224A contacts the capacitor electrode 208A, the conductive line 232A contacts the conductive via 224A, the conductive via 234A contacts the conductive line 232A, the conductive line 236A contacts the conductive line 236A. The path of the conductive via 224A, the conductive line 232A, the conductive via 234A, the conductive line 236A electrically couples the capacitor electrode 208A to the top surface of the interconnect structure 230. Similarly, the path of the conductive via 224B, the conductive line 232B, the conductive via 234B, the conductive line 236B electrically couples the capacitor electrode 208A to the top surface of the interconnect structure 230; the path of the conductive via 224C, the conductive line 232C, the conductive via 234C, the conductive line 236C electrically couples the capacitor electrode 208C to the top surface of the interconnect structure 230; the path of the conductive via 224D, the conductive line 232D, the conductive via 234D, the conductive line 236D electrically couples the capacitor electrode 208D to the top surface of the interconnect structure 230.

One way for metal routing is to connect the capacitor electrodes of the same polarity and corresponding through via by the metal layers of an interconnect structure. For example, since the capacitor electrodes 208A and 208C are of the same polarity, the conductive line 232A electrically connected to the capacitor electrode 208A and the conductive line 232C electrically connected to the capacitor electrode 208C may be connected. Further, the conductive line 232E may also be merged to electrically connect to the through via 222A. That is, the conductive lines 232A, 232C, and 232E in the M1 layer may be one conductive line. Similarly, the conductive lines 236A, 236C, and 236E in the M2 layer may be one conductive line. In other words, one way for metal routing is that the interconnect structure 230 internally provides the electrical connection among the capacitor electrodes of the same polarity and corresponding through vias. However, such a configuration represents a structure sensitive to “antenna effect.” The antenna effect involves charging in a discrete conductive layer region formed over the surface of a substrate that causes excessive current that can charge and damage the characteristics of underlying dielectric materials. Plasma etching and various deposition processes involving a glow discharge naturally result in electric charging in some regions of the upper substrate surface and cause the antenna effect. The resulting “antenna effect” causes excessive current by which the characteristics of an oxide or other dielectric layer located beneath the conductive layer can be severely degraded, and which can further cause blowout of underlying conductive or semiconductor components. The antenna effect occurs when conductive features act as “antennas” amplifying the charging effect. Via-induced metal-island corrosion (VIMIC) is a common failure due to antenna effect. Connecting conductive lines in the same metal layer forms lengthy conductive features suspended over underneath electronic components, such as DTCs, which represents one embodiment of a conductive structure that acts as an antenna.

As a comparison, in the illustrated embodiment, the paths for respective capacitor electrodes and through vias are electrically isolated from each other. That is, the interconnect structure 230 brings each capacitor electrode (and through vias if presented) to its top surface but does not provide electrical connections inside the metal layers of the interconnect structure 230. The conductive lines in each metal layer remain separated and would not form one large conductive feature suspended above the DTC 214. As to be discussed in detail below, electrical connections among the capacitor electrodes of the same polarity and corresponding through vias are provided by contact pads formed in subsequent processes.

Figure 13:
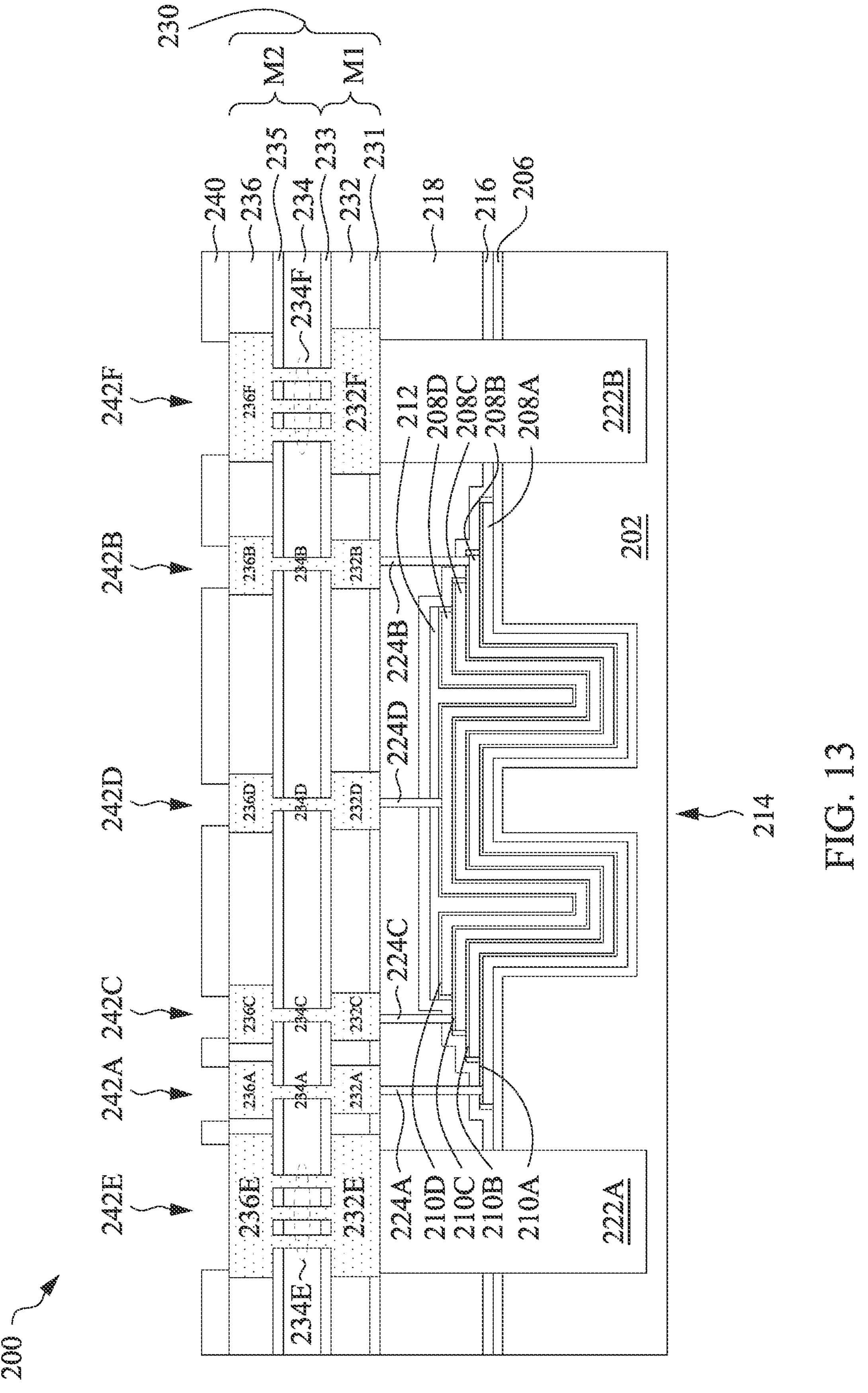

The method 100 at operation 124 (FIG. 1) forms a first passivation layer 240 over the interconnect structure 230, such as shown in FIG. 13. In some embodiments, the first passivation layer 240 may comprise one or more layers of non-photo-patternable insulating materials, one or more layers of photo-patternable insulating materials, a combination thereof, or the like. The non-photo-patternable insulating materials may comprise silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. The photo-patternable insulating materials may comprise polybenzoxazole (PBO), polyimide (PI), benzocyclobutene (BCB), a combination thereof, or the like, and may be formed using a spin-on coating process, or the like. In some embodiments, the first passivation layer 240 has a thickness between about 0.5 um and about 5 um. In some embodiments, the first passivation layer 240 has a thickness between about 5 nm and about 5 um. In the illustrated embodiment, the openings 242A-242F are formed in the first passivation layer 240 to expose portions of the conductive lines 236A-236F, respectively. In some embodiments, the first passivation layer 240 may be patterned using suitable photolithography and etching method. In some embodiments, the each of the openings has a width between about 500 nm and about 5000 nm.

Figure 14:
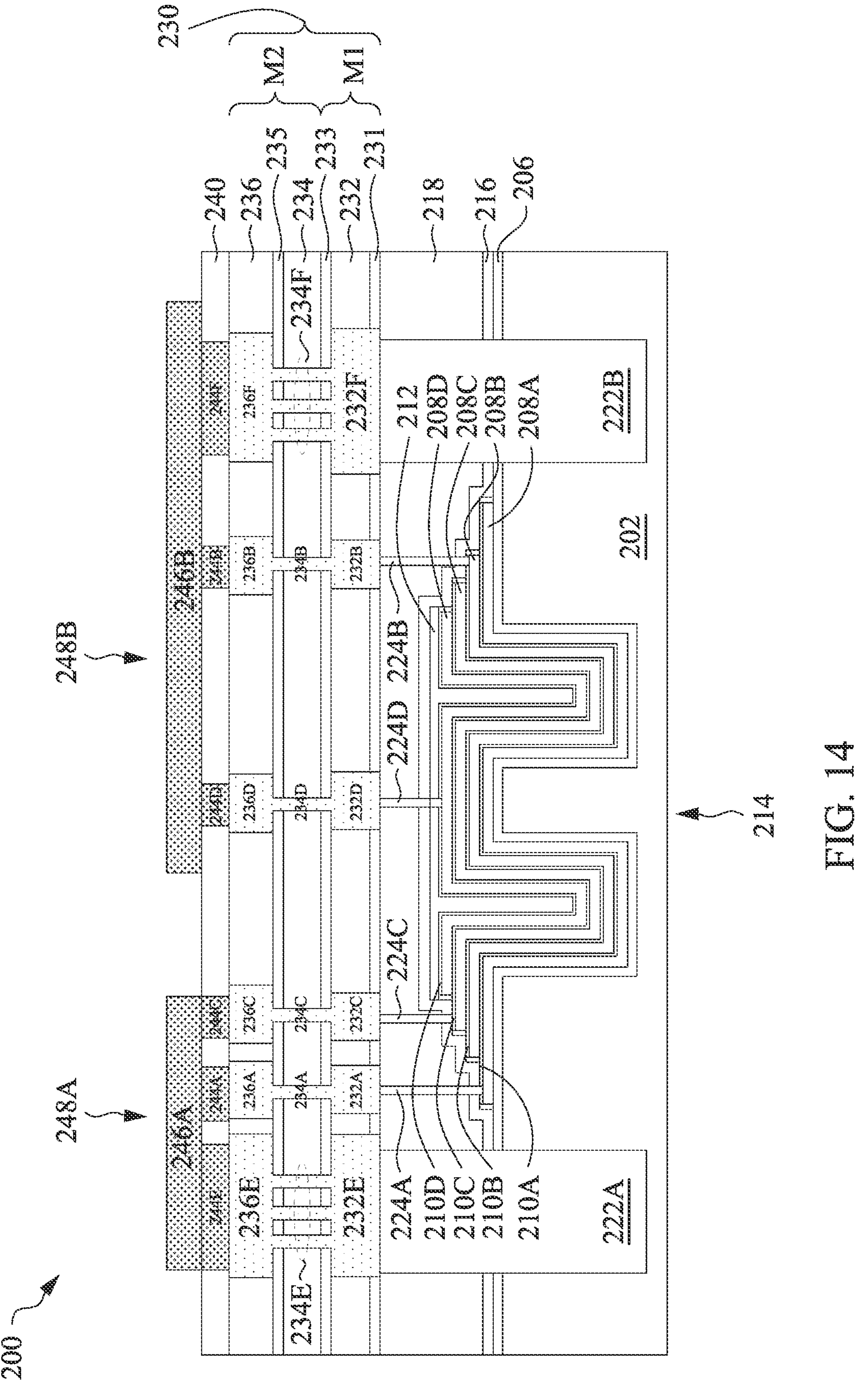

The method 100 at operation 126 (FIG. 1) forms contact pads 248A and 248B over the interconnect structure 230, such as shown in FIG. 14. The contact pad 248A is in electrical contact with the conductive lines 236A, 236C, and 236E. The contact pad 248B is in electrical contact with the conductive lines 236D, 236B, and 236F. The contact pad 248A includes lower portions 244A, 244C, and 244E formed in the openings 242A, 242C, and 242E, respectively, and surrounded by the first passivation layer 240. The contact pad 248A further includes upper portion 246A in electrical contact with the lower portions 244A, 244C, and 244E. The contact pad 248B includes lower portions 244B, 244D, and 244F formed in the openings 242B, 242D, and 242F, respectively, and surrounded by the first passivation layer 240. The contact pad 248B further includes upper portion 246B in electrical contact with the lower portions 244B, 244D, and 244F.

In some embodiments, lower and upper portions of the contact pads 248A and 248B may comprise same conductive material such as aluminum, copper, tungsten, silver, gold, a combination thereof, or the like. In some embodiments, a conductive material may be formed over the interconnect structure 230 using, for example, CVD, PVD, ALD, electrochemical plating, electroless plating, a combination thereof, or the like. Subsequently, the conductive material is patterned to form the contact pads 248A and 248B. In some embodiments, the conductive material may be patterned using suitable photolithography and etching methods.

In some embodiments, lower and upper portions of the contact pads 248A and 248B may comprise different conductive materials. For example, the lower portions 244A-244F are formed of a barrier-type material that has a higher density and surface roughness than upper portions 246A and 246B. Suitable barrier-type material may include Ta, TaN, TiN, Ti, In, Ga, and combination thereof. The upper portions 246A and 246B may include an aluminum-containing material or essentially of aluminum in one embodiment. For example, the upper portions 246A and 246B are formed of various aluminum alloys in other embodiments. In one embodiment, the upper portions 246A and 246B are formed of aluminum copper. The lower and upper portions may be formed by two different deposition techniques, such as sputtering for the lower portions and blanket deposition for the upper portions. The aluminum-containing contact pads 248A and 248B are also referred to as aluminum pad or Alpad. Alpads are formed over the device metallization layers (e.g., the illustrated interconnect structure 230) and are coupled to solder balls or bonding wires or other connective features that couple the semiconductor device to external components.

Figure 21B:
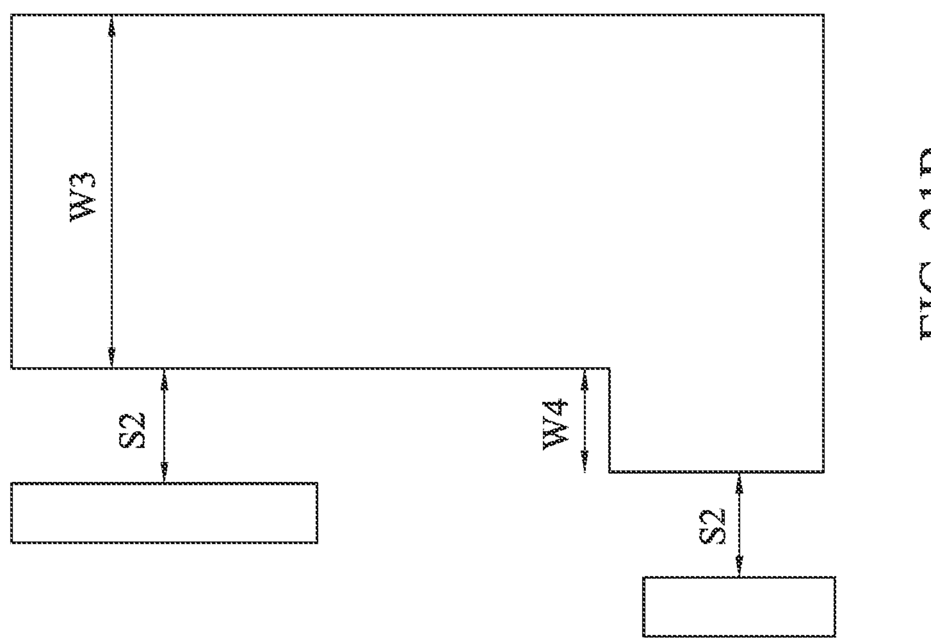
FIGS. 21A, 21B, 21C, 21D, 21E, and 21F illustrate various design rules of contact pads, according to various aspects of the present disclosure.
Figure 21A:
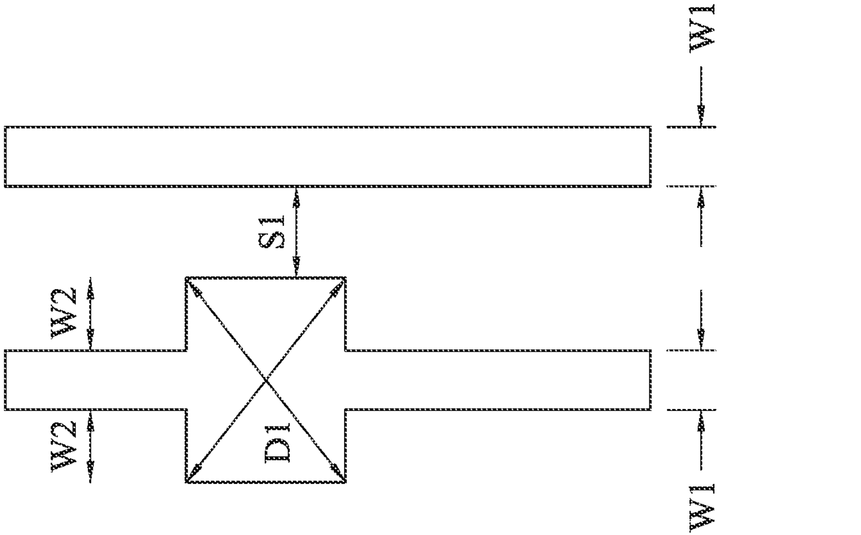
Figures 21C, 21D, 21E:
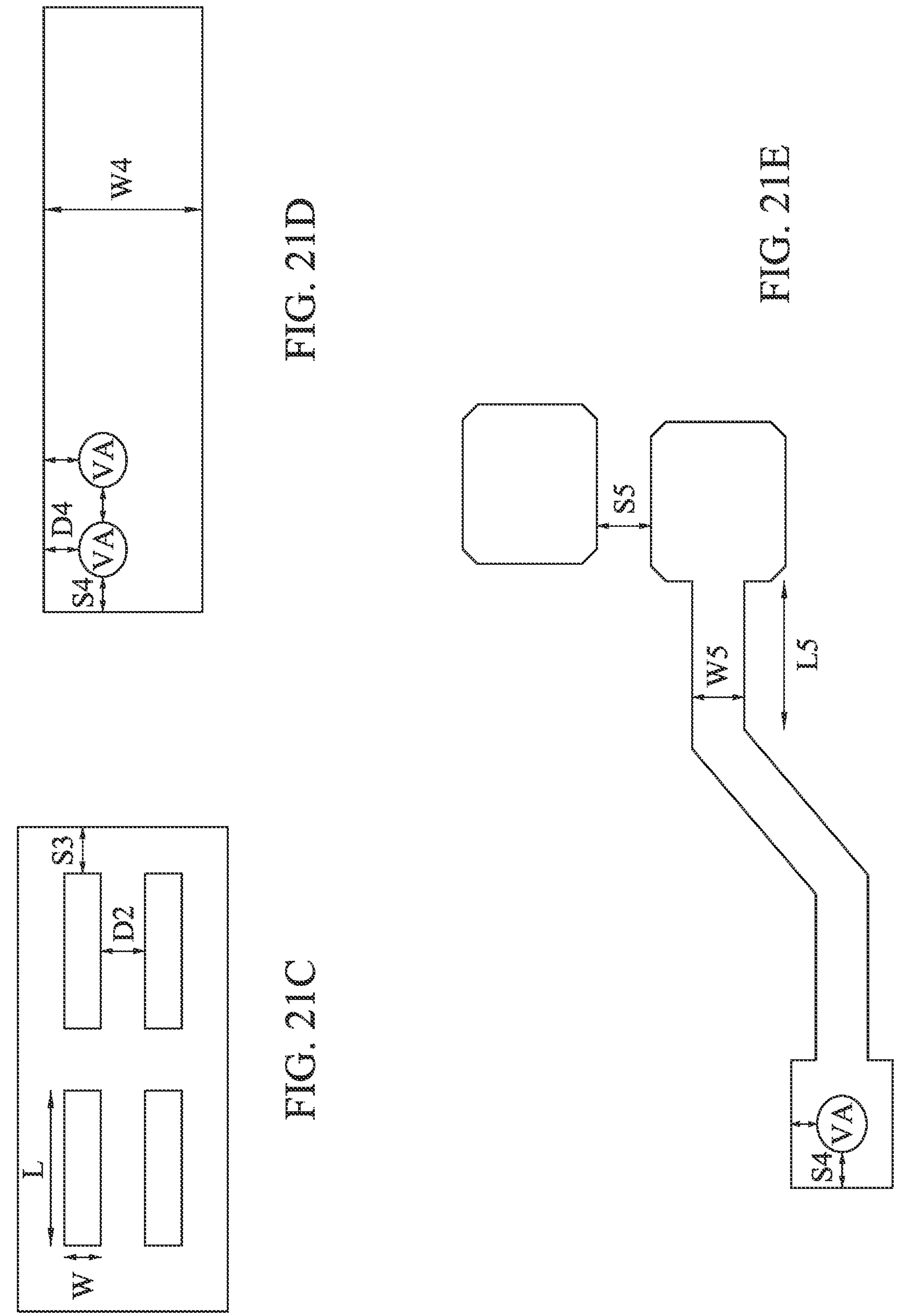

To electrically connect the capacitor electrodes and through vias, the contact pads 248A and 248B may have irregular shapes in a top view, such as including via pads, solder ball landing pads, and traces connecting vias pads and landing pads (e.g., FIG. 21E). For example, in a top view, the portions of the contact pads having lower portions underneath are via pads of medium sizes, the portions of the contact pads exposed by openings in the second passivation layer are solder ball landing pads with large sizes, and rest portions are traces with small widths connecting via pads and landing pads. In some embodiments, a via pad and a landing pad may be a same pad. Sizes of the contact pads 248A and 248B may also be larger than regular contact pads of a uniform size. The sizes (as well as shapes from a top view) of the contact pads 248A and 248B are also different (e.g., 248B is larger than 248A as depicted). Even the contact pads may become larger, since the contact pads are distant away from the substrate, the antenna effect is weak at such high metal and the DTCs are protected from plasma damage. Further, the barrier-type material with higher density and surface roughness in the lower portions 244A-244F of the contact pads 248A and 248B resists plasma arcs and provides further protection to DTCs underneath.

Figure 15:
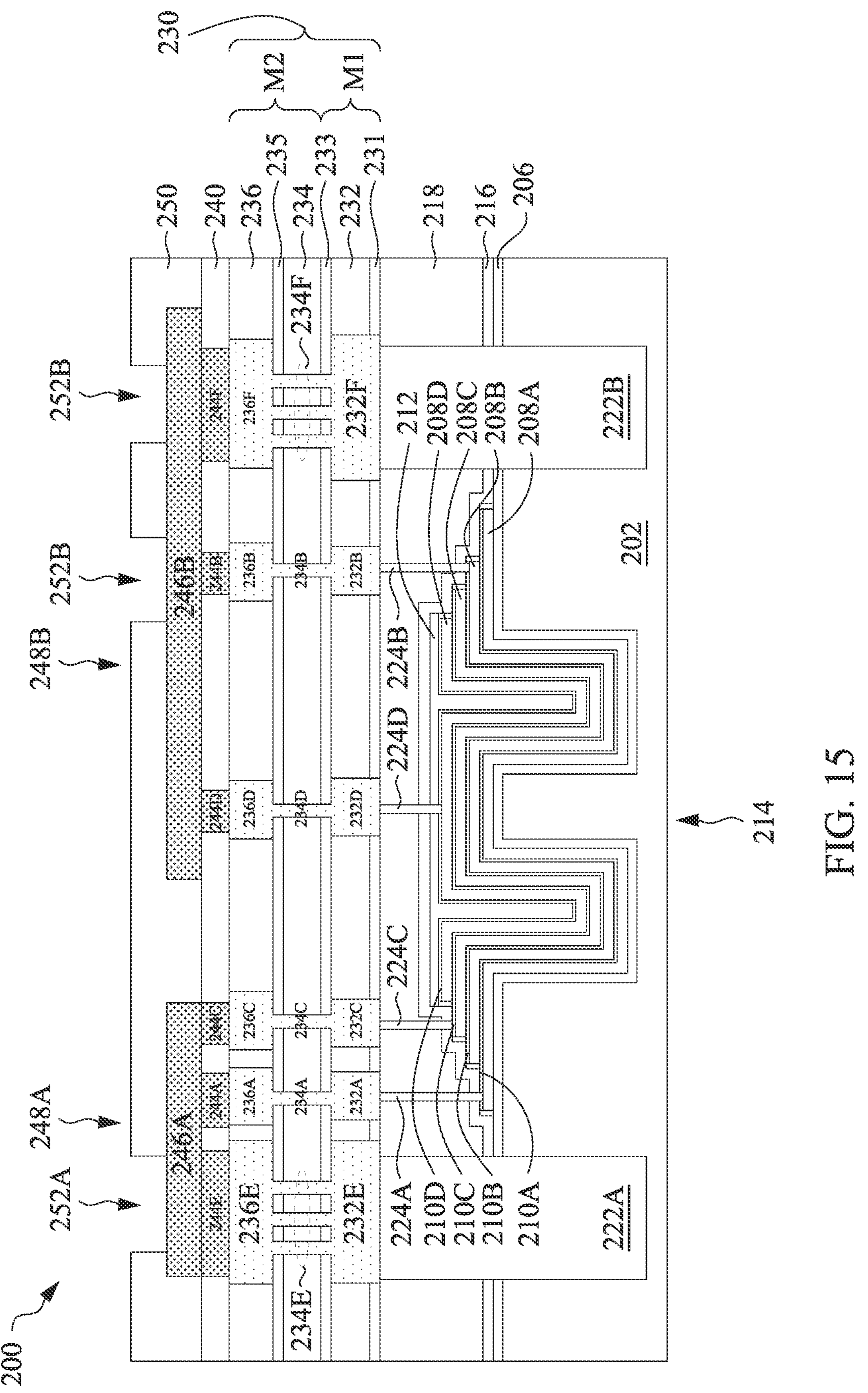

The method 100 at operation 128 (FIG. 1) forms a second passivation layer 250 over the first passivation layer 240, such as shown in FIG. 15. In some embodiments, the first passivation layer 240 and the second passivation layer 250 may comprise different insulating materials. For example, the first passivation layer 240 may include non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. The second passivation layer 250 may include photo-patternable insulating materials such as polybenzoxazole (PBO), polyimide (PI), benzocyclobutene (BCB), a combination thereof, or the like, and may be formed using a spin-on coating process, or the like. In some embodiments, the second passivation layer 250 has a thickness between about 0.5 um and about 5 um. In some embodiments, the second passivation layer 250 has a thickness between about 10 nm and about 5 um. In some embodiments, the openings 252A and 252B are formed in the second passivation layer 250 to expose portions of the contact pads 248A and 248B, respectively. In some embodiments, the second passivation layer 250 may be patterned using suitable photolithography and etching method to form the openings 252A and 252B. In some embodiments, the openings 252A and 252B have a width between about 500 nm and about 5000 nm. The numbers of openings 252A and 252B dependent on performance needs. In the illustrated embodiment, more openings 252B are formed on the contact pad 248B than the openings 252A on the contact pad 248A as an effort to compensate the relatively large resistance due to larger size of the contact pad 248B.

Figure 16A:
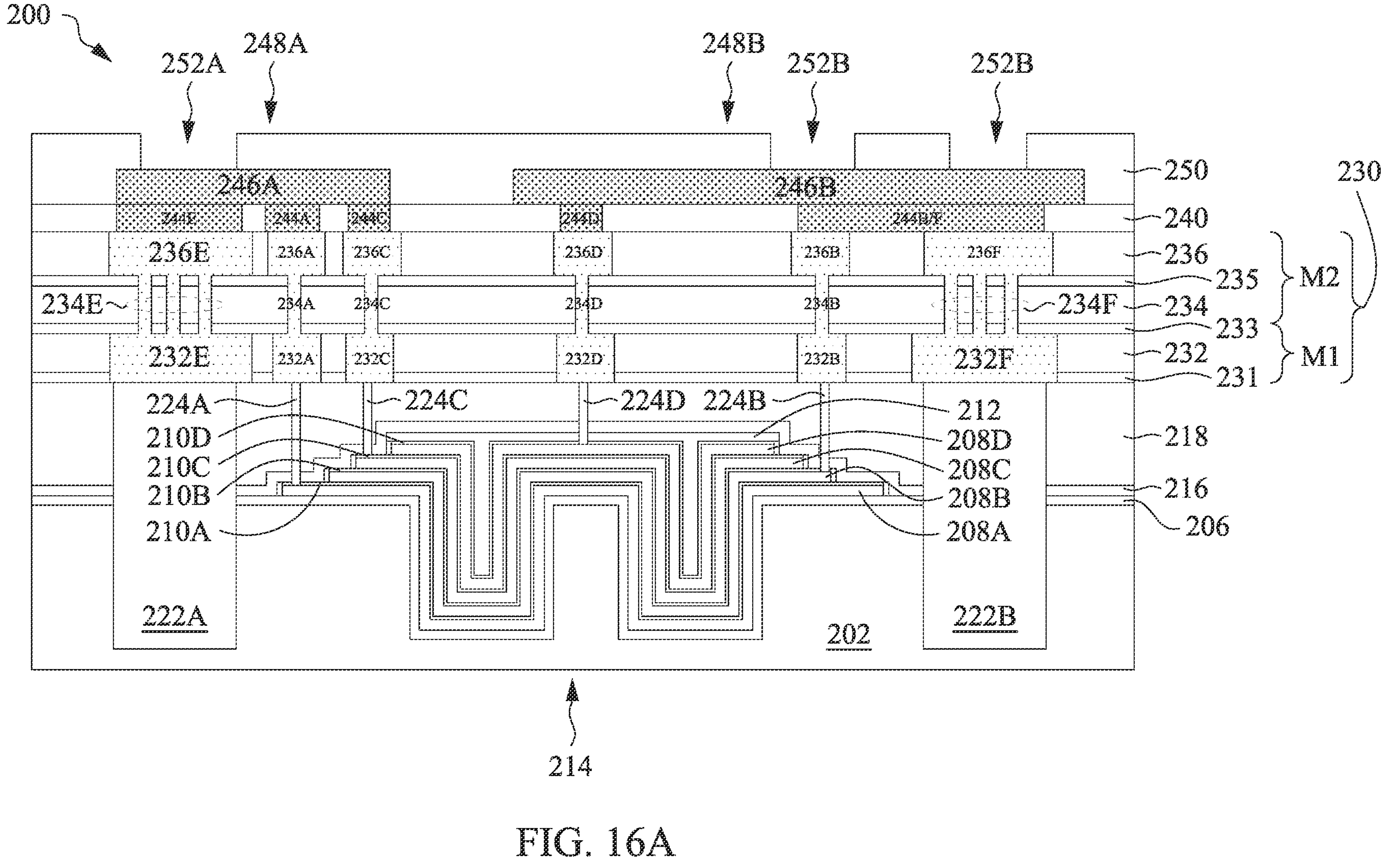
Figure 16B:
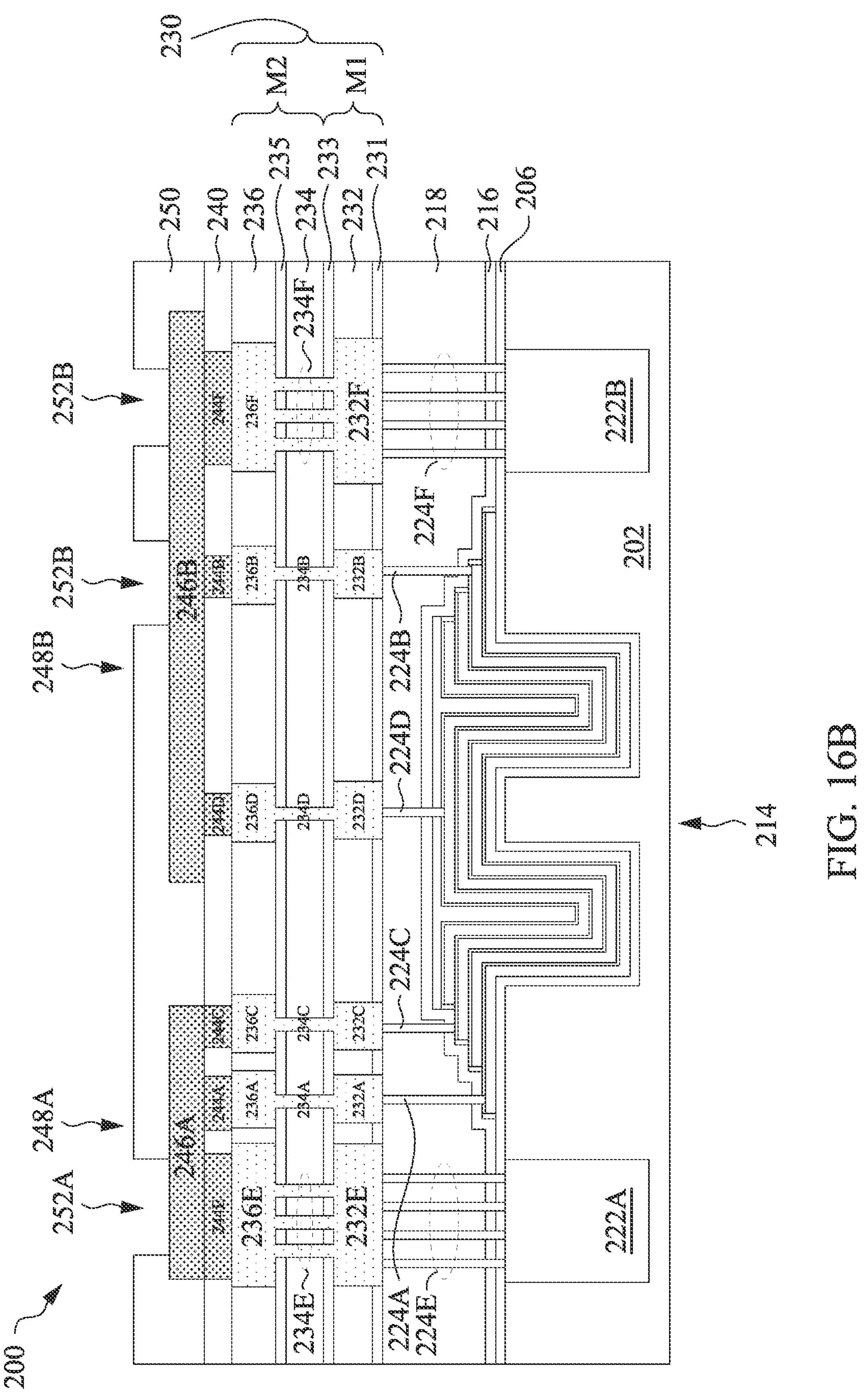
Figure 16C:
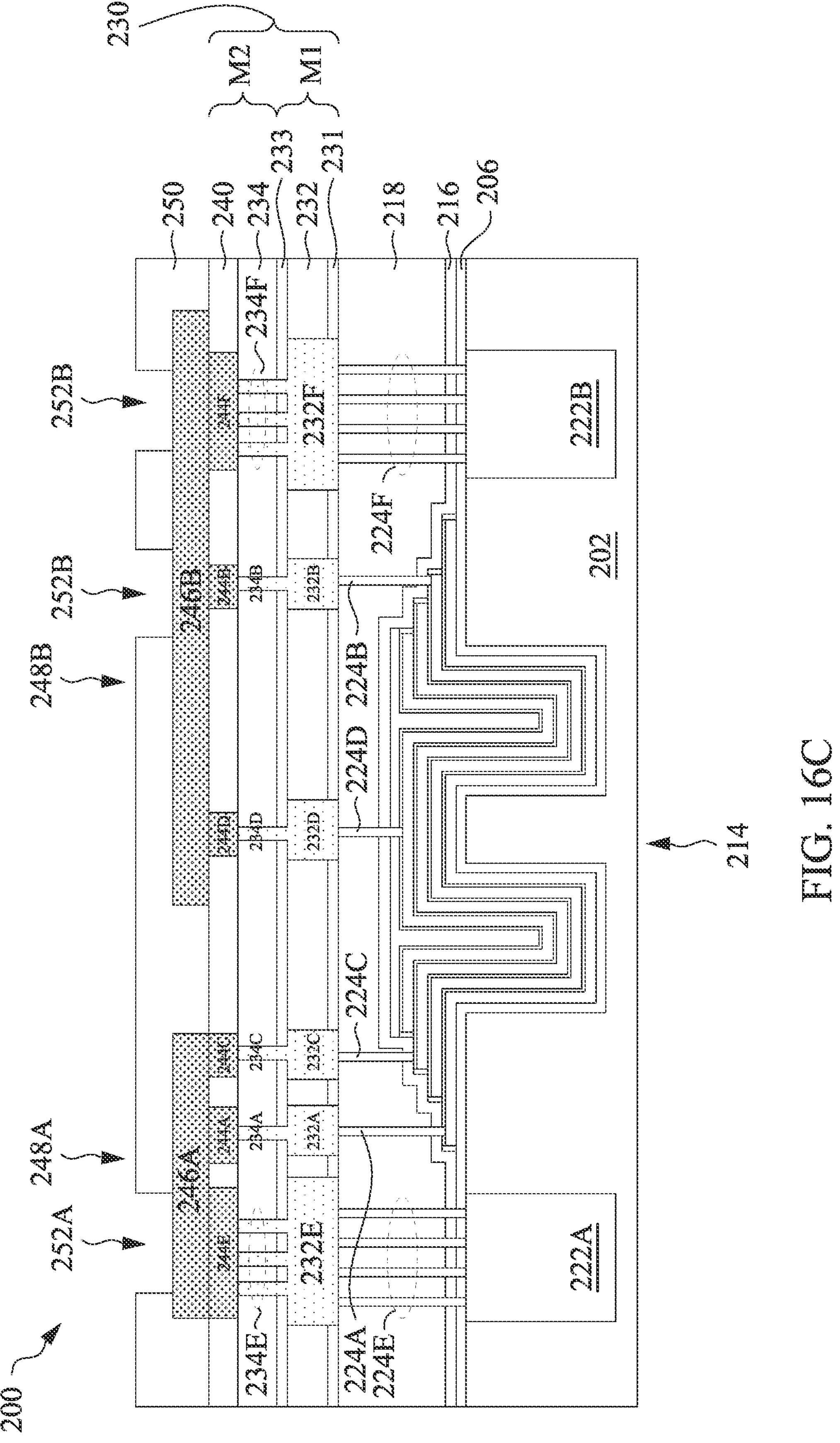

FIGS. 16A-16C illustrate some alternative embodiments of the device 200 at the conclusion of operation 128. Referring to FIG. 16A, one difference between the embodiments in FIGS. 16A and 15 is that in FIG. 15 lower portions of the contact pads in the first passivation layer remain isolated from each other, while in FIG. 16A some lower portions may merge as one continuous lower portion in the level of the first passivation layer. For example, the lower portions 244B and 244F may merge as one lower portion 244B/F. The lower portion 244B/F electrically couples the capacitor electrode 208B with the through via 222B. The lower portion 244B/F remains isolated from the lower portion 244D, which are electrically connected together by the upper portion 246B in the level of the second passivation layer. This configuration provides further routing flexibility. Even the lower portion 244B/F as a larger conductive feature is closer to the substrate than the upper portion, its barrier nature and surface roughness still provide effective mitigation against plasma damage.

Referring to FIG. 16B, one difference between embodiments in FIGS. 16B and 15 is that in FIG. 15 the through vias 222 protrude through the dielectric layer 218 and in FIG. 16 the through vias 222 are formed prior to the formation of the dielectric layer 218 and is below the dielectric layer 218. A plurality of conductive vias 224E are formed in the dielectric layer 218, providing electrical connection between the through via 222A and the conductive line 232E. A plurality of conducive vias 224F are formed in the dielectric layer 218, providing electrical connection between the through via 222B and the conductive line 232F. The conductive vias 224E and 224F may be formed together with the conducive vias 224A-224D at operation 120.

Referring to FIG. 16C, one difference between embodiments in FIGS. 16C and 15 is that in FIG. 15 the lower portions 244A-244F contact the conductive lines 236A-236F, respectively, and in FIG. 16C the lower portions 244A-244F contact the conductive vias 234E-234F, respectively. Without having the dielectric layer 236, the height of the M2 layer is reduced and the overall device height is also reduced, which is beneficial for assembly and packaging.

In the following figures, the manufacturing operations after the structure shown in FIG. 15 is formed are explained. However, the same operations can be applied to the structure shown in FIGS. 16A-16C.

Figure 17:
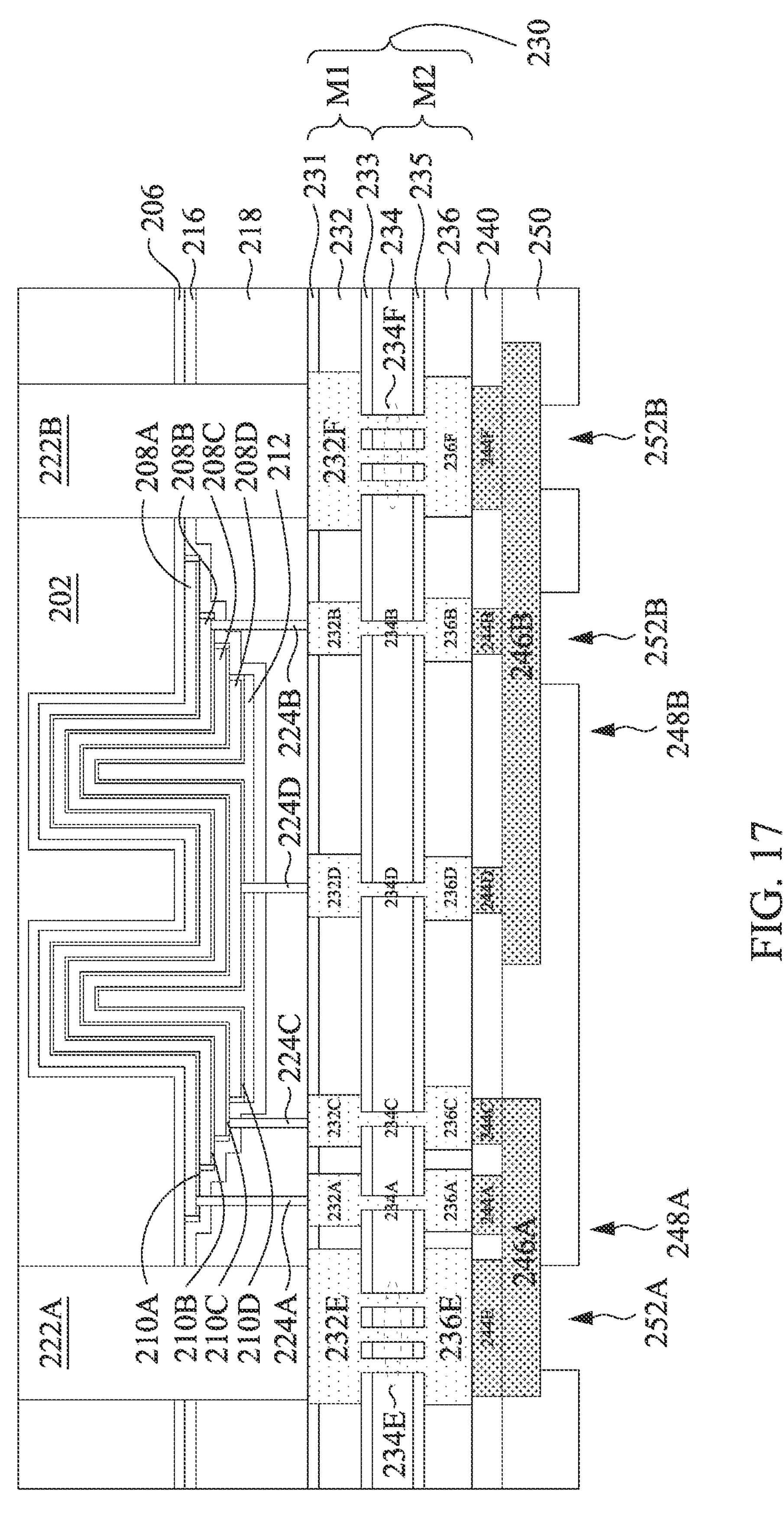

The method 100 at operation 130 (FIG. 1) flips the device 200 upside down and thins down the device 200 from the backside of the device 200 until the through vias 222 are exposed from the backside of the device 200, such as shown in FIG. 17. In some embodiments, the frontside of the device 200 is attached to a carrier (not shown). This makes the device 200 accessible from the backside of the device 200 for further processing. The operation 130 may use any suitable attaching processes, such as direct bonding, hybrid bonding, using adhesive, or other bonding methods. The operation 130 may further include alignment, annealing, and/or other processes. The carrier may be a silicon wafer in some embodiments. The backside thinning process may include a mechanical grinding process and/or a chemical thinning process. A substantial amount of substrate material may be first removed from the substrate 202 during a mechanical grinding process. Afterwards, a chemical thinning process may apply an etching chemical to the backside of the substrate 202 to further thin down the substrate 202.

Figure 18:
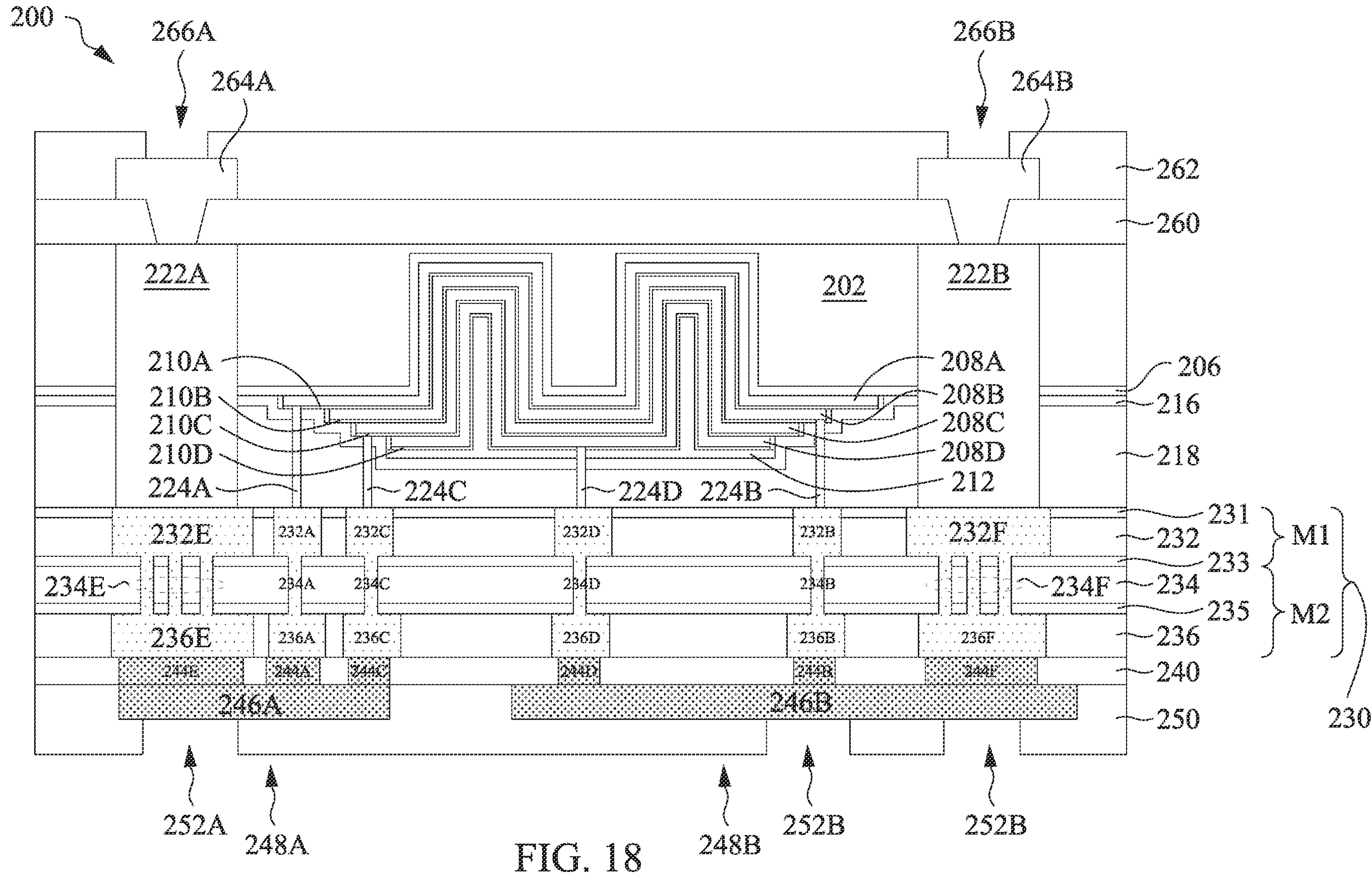
Figure 19:
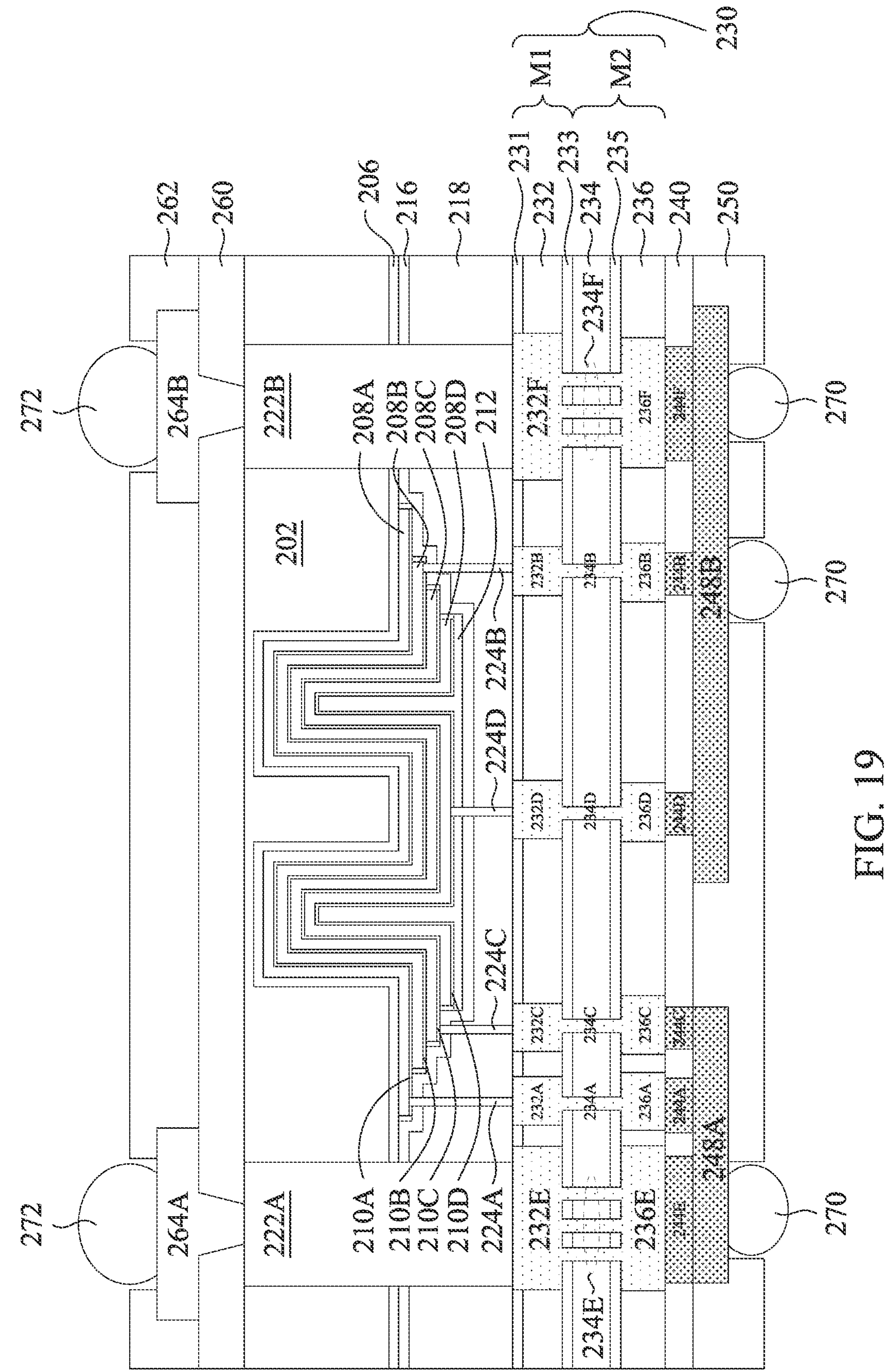

The method 100 at operation 132 (FIG. 1) forms backside passivation layers 260 and 262 and backside contact pads 264A and 264B, such as shown in FIG. 18. The material composition of the backside passivation layers 260 and 262 may be similar to the frontside passivation layers 240 and 250. For example, the first backside passivation layer 260 may include non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. The second backside passivation layer 262 may include photo-patternable insulating materials such as polybenzoxazole (PBO), polyimide (PI), benzocyclobutene (BCB), a combination thereof, or the like, and may be formed using a spin-on coating process, or the like. The backside contact pads 264A and 264B are embedded in the backside passivation layers 260 and 262. The openings 266A and 266B are formed in the second backside passivation layer 262 to expose portions of the backside contact pads 264A and 264B, respectively.

In some embodiments, lower and upper portions of the backside contact pads 264A and 264B in the levels of the backside passivation layers 260 and 262 may comprise same conductive material such as aluminum, copper, tungsten, silver, gold, a combination thereof, or the like. In some embodiments, a conductive material may be formed using, for example, CVD, PVD, ALD, electro-chemical plating, electroless plating, a combination thereof, or the like. Subsequently, the conductive material is patterned to form the backside contact pads 264A and 264B. In some embodiments, the conductive material may be patterned using suitable photolithography and etching methods. Since the through vias 222 alone have less risk of introducing antenna effect, the selection of conductive materials for forming backside contact pads 264A and 264B is more flexible. In furtherance of embodiments, the backside contact pads 264A and 264B have different material composition from the frontside contact pads 248A and 248B. In one example, the frontside contact pads 248A and 248B are Alpads (e.g., an alloy of Al—Cu), and the backside contact pads 264A and 264B are pads containing nickel-palladium-gold (NiPdAu) or an alloy of NiPdAu with copper (NiPdAu—Cu) to fit different circuit performance needs.

The method 100 at operation 134 (FIG. 1) forms connectors 270 on the frontside contact pads 248A and 248B, and connectors 272 on the backside contact pads 264A and 264B. In some embodiments, each of the connectors 270 and 272 may be a solder ball, a controlled collapse chip connection (C4) bump, a ball grid array (BGA) ball, a micro bump, an electroless nickel-electroless palladium-immersion gold technique (ENEPIG) formed bump, a copper pillar, a combination thereof, or the like. In the illustrated embodiments, the backside contact pads are larger than the frontside contact pads, and the connectors 272 are larger than the connectors 270. In furtherance of embodiments, the connectors 272 are large solder balls, and the connectors 270 are small solder balls. The number of connectors 270 may be larger than the connectors 272 as depicted. In some embodiments where the connectors 270 and 272 are formed of solder materials, a reflow process may be performed in order to shape the solder material into the desired bump shapes. In some embodiments, after forming the connectors 270 and 272, the semiconductor wafer carrying the device 200 is diced to form individual semiconductor devices. The dicing process may include sawing, a laser ablation method, an etching process, a combination thereof, or the like. Subsequently, each of the individual semiconductor devices may be tested to identify known good dies (KGDs) for further processing.

Figure 20:
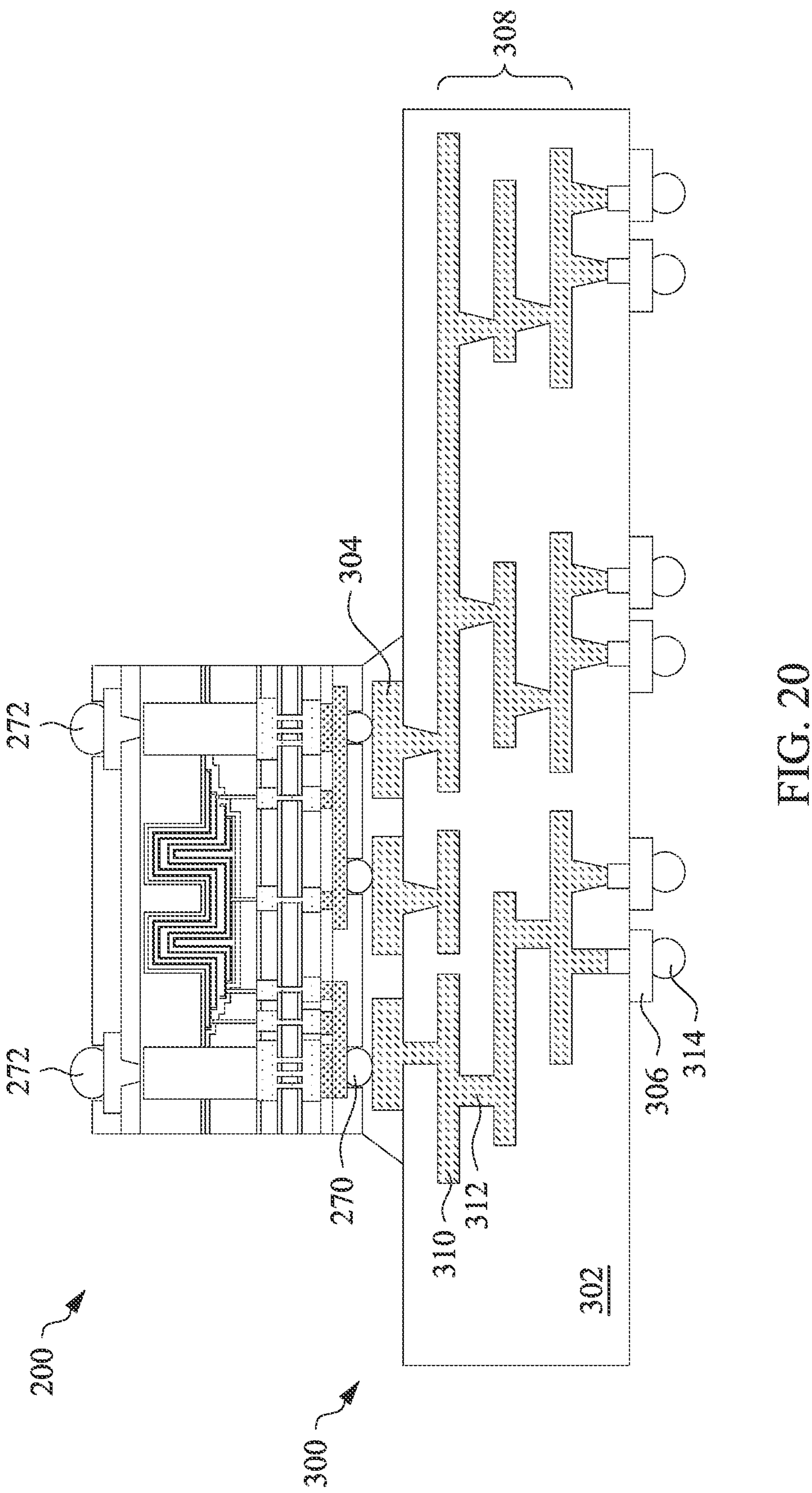

The method 100 at operation 136 (FIG. 1) bonds the device 200 to an interposer 300 to form a stacked structure, such as shown in FIG. 20. The interposer 300 includes a substrate 302, contact pads 304, contact pads 306, metallization layers 308 that includes conductive lines 310 and conductive vias 312. The device 200 may be bonded to the interposer 300 through flip-chip bonding technology and/or surface mount technology. In some embodiments, the substrate 302 is an organic flexible substrate or a printed circuit board. In some embodiments, the contact pads 304 and the contact pads 306 are respectively distributed on two opposite sides of the substrate 302 and are exposed for electrically connecting with later-formed elements/features. In some embodiments, the metallization layers 308 are embedded in the substrate 302 and provides routing function for the interposer 300, where the conductive lines 310 and the conductive vias 312 are electrically connected to the contact pads 304 and the contact pads 306. That is, at least some of the contact pads 306 are electrically connected to some of the contact pads 304 through the metallization layers 308. In some embodiments, the contact pads 304 and the contact pads 306 may include metal pads or metal alloy pads. In some embodiments, the materials of the contact pads 304/306 may be substantially the same or similar to the materials of the frontside contact pads 248A/248B and/or the backside contact pads 264A/264B. In some embodiments, the materials of the metallization layers 308 and the vias may be substantially the same or similar to the materials of the interconnect structure 230. A plurality of connectors 314 are connected to the contact pads 306. Through the contact pads 306 and the contact pads 304, some of the connectors 314 are electrically connected to the capacitor electrodes. In some embodiments, the connectors 314 are solder balls or BGA balls.

Contact pads generally have a uniform size and shape. As a comparison, regarding embodiments of the present disclosure, contact pad design is robust. For example, the contact pads 248A and 248B in the device 200 may differ in sizes and shapes from a top view, as these contact pads need to have suitable sizes and shapes to provides electrical connection among capacitor electrodes. For example, the contact pad 248B has to extend to a position in the middle of the DTC 214 (i.e., middle of the two trenches 204) to contact the conductive line 236D, in the illustrated embodiment. FIGS. 21A-21F illustrate some spacing and dimensions regarding designing such contact pads. These dimensions may be included in a design rule, such as an Alpad design rule.

Figure 21F:
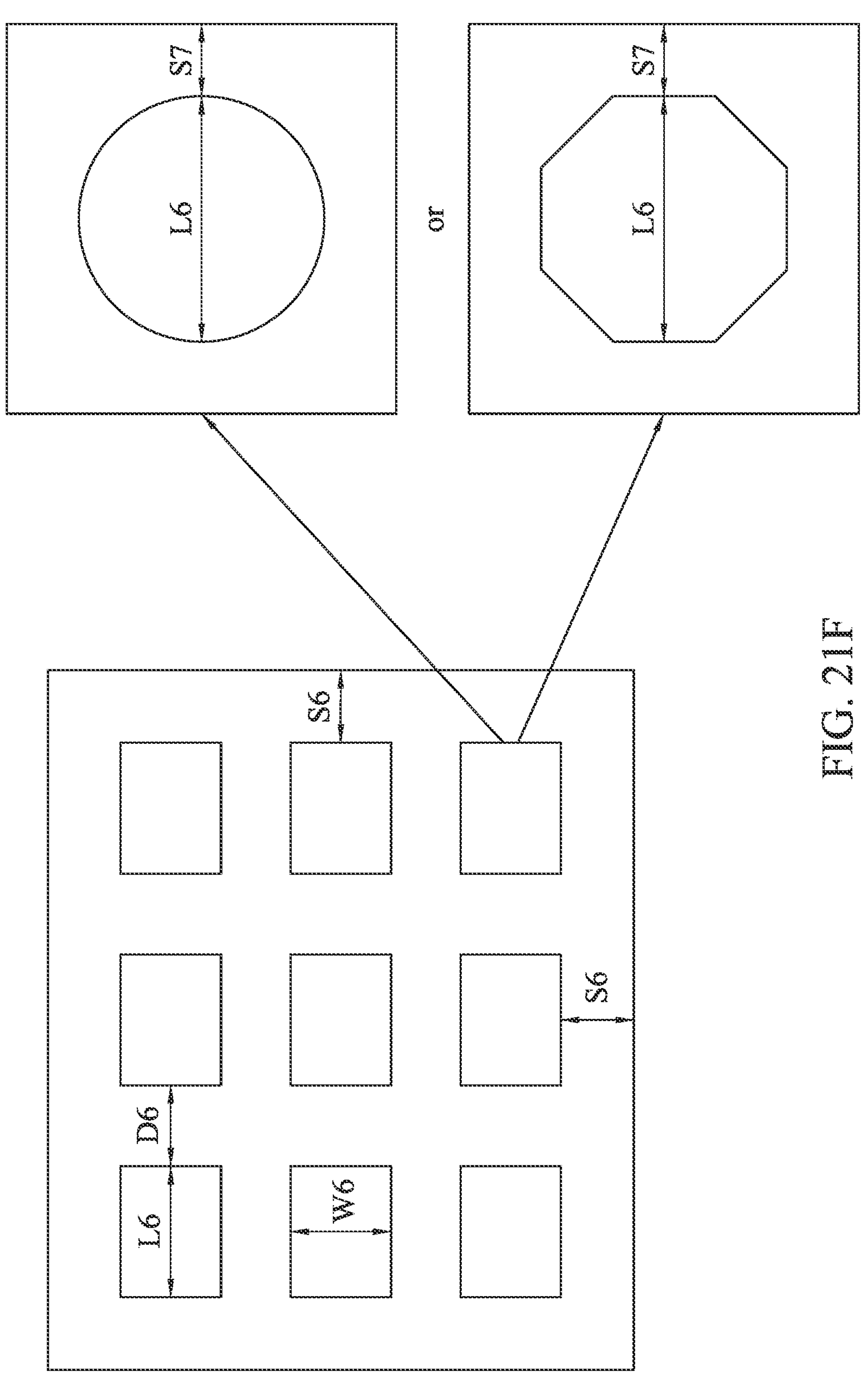

To ensure even distribution of Alpads over the chip, the Alpad pattern density over any 200 um×200 um area may range from about 10% to about 50%, and the Alpad pattern density over the whole chip may range from about 10% to 50%, in some embodiments. Rectangular shape may be used as a default shape for an Alpad design and extra shapes can be added. Referring to FIG. 21A, when the contact pads include a narrow trace, the minimum width W1 is not less than about 0.5 um in some embodiments. If W1 is less than about 0.5 um, the routing resistance becomes large and slows down circuit speed. The minimum spacing 51 between adjacent narrow traces is not less than about 0.3 um in some embodiments. If 51 is less than about 0.3 um, the interference becomes large and degrades signal integrity. If the narrow trace includes a via pad to connect to a conductive via underneath, the via pad protrudes from edges of the narrow trace for a width W2 that is not less than about 0.2 um in some embodiments. If W2 is less than about 0.2 um, the via pad may not provide sufficient landing area for conductive vias. The diagonal distance D1 of the via pad is not less than about 0.7 um in some embodiments, which ensures sufficient landing area for conductive vias. Referring to FIG. 21B, when the contact pads include a wide trace, the width W3 may be larger than about 10 um in some embodiments. Edge deviation W4 is controlled within 1 um in some embodiments to ensure smoothness of the edges. The minimum spacing S2 to an adjacent trace is not less than about 0.5 um in some embodiments. If S2 is less than about 0.5 um, the interference becomes large and degrades signal integrity. Referring to FIG. 21C, a contact pad may include holes to reduce metal density and increase metal flatness. A hole may have a width W not less than about 3 um and a length L not less than about 3 um in some embodiments. Distance D2 between adjacent holes is not larger than about 7 um and spacing S3 between a hole and an edge of a contact pad is not larger than about 7 um in some embodiments. Referring to FIG. 21D, a contact pad may have a width W4 not larger than about 31 um without having a hole in some embodiments. If the width is larger than about 31 um, the metal flatness may deteriorate. Distance D4 between vias and spacing S4 between vias and edges each are not less than about 0.5 um in some embodiments to mitigate alignment inaccuracy during lithography process. Referring to FIG. 21E, a contact pad may include multiple via pads connected by trace(s) (or via pads and exposed portions for solder balls connected by trace(s)). The trace may have bends, such as a 45° slanted segment. The joints between a slanted segment and a via pad has a length L5 and a width W5 each not less than about 1.8 um in some embodiments. A distance S5 between adjacent via pads is not less than about 2.25 um in some embodiments. If S5 is less than about 2.25 um, the interference becomes large and degrades signal integrity. Referring to FIG. 21F, regarding portions of the contact pads exposed in the second passivation layer for landing solder balls, a distance D6 between adjacent exposed portions and a spacing S6 to an edge of the die each are not less than about 5 um in some embodiments. A width W6 and a length L6 of each exposed portion are not less than about 5 um in some embodiments. The exposed portion may have shapes other than a rectangle, such as a circle or an octagon. For a non-rectangle shape, the spacing S7 may be loosened to be not less than about 8 um in some embodiments.

By having an interconnect structure that brings electrodes (terminals) of electronic components to a contact pad level without connecting lower metal wiring locally, isolated lower metal wires and robust contact pad design effectively avoid forming lengthy metal wires suspended above electronic components, which mitigates interconnect failure due to antenna-type effect and plasma arcing. Furthermore, various embodiments discussed herein allow for increasing device (e.g., capacitor) density and improving semiconductor device yield.

In one exemplary aspect, the present disclosure is directed to a method. The method includes forming a metal-insulator-metal (MIM) structure in a substrate, the MIM structure including a plurality of first electrodes of a first polarity and a plurality of second electrodes of a second polarity, forming an interconnect structure over the substrate, the interconnect structure including conductive paths electrically connecting to the first and second electrodes, the conductive paths being isolated from each other inside the interconnect structure, and forming first and second contact pads over the interconnect structure, the first contact pad electrically connecting a first portion of the conductive paths corresponding to the first electrodes, and the second contact pad electrically connecting a second portion of the conductive paths corresponding to the second electrodes. In some embodiments, the MIM structure is a deep trench capacitor (DTC). In some embodiments, the forming of the MIM structure includes etching the substrate to form at least first and second trenches, depositing a stack of conductive layers and dielectric layers alternatively arranged in the first and second trenches, and patterning the stack to form the MIM structure. In some embodiments, in a cross-sectional view the second contact pad extends in a way such that the second trench is fully under the second contact pad, and at least a center portion of the first trench is positioned directly under a gap between the first and second contact pads. In some embodiments, the method further includes depositing first and second passivation layers over the interconnect structure, each of the first and second contact pads including a plurality of lower portions surrounded by the first passivation layer and an upper portion surrounded by the second passivation layer and contacting each of the lower portions. In some embodiments, each of the lower portions electrically connects one of the conductive paths in the interconnect structure. In some embodiments, the lower portions and the upper portion include different conductive materials. In some embodiments, the upper portion includes aluminum. In some embodiments, the first and second contact pads are aluminum-containing pads. In some embodiments, the method further includes forming first and second through vias on opposing sides of the MIM structure, the first and second through vias extending through the substrate, the first contact pad electrically connecting the first through via to the first electrodes, the second contact pad electrically connecting the second through via to the second electrodes, and the first and second through vias remaining electrically isolated from the first and second electrodes within the interconnect structure.

In another exemplary aspect, the present disclosure is directed to a method. The method includes forming a trench in a substrate, depositing a stack of alternating conductive layers and dielectric layers in the trench, depositing a dielectric layer over the stack, forming conductive vias extending through the dielectric layer and contacting the conductive layers, forming one or more metallization layers over the dielectric layer, the conductive vias remaining electrically isolated from each other through the metallization layers, forming a passivation layer over the metallization layers, and forming contact pads embedded in the passivation layer, each of the contact pads electrically connecting two or more of the conductive vias. In some embodiments, in a top view at least one of the contact pads includes a via pad connected to a trace, and the via pad has a width larger than the trace. In some embodiments, the trace has a straight portion extending from the via pad and a bended portion connected to the straight portion. In some embodiments, the contact pads include an aluminum alloy. In some embodiments, the method further includes forming through substrate vias (TSVs) extending through the substrate, the TSVs being electrically connected to the conducive vias through the contact pads. In some embodiments, the method further includes forming backside contact pads on a backside surface of the substrate, the backside contact pads being electrically connected to the conducive vias through the TSVs and the contact pads. In some embodiments, the contact pads are Al—Cu pads, and the backside contact pads are NiPdAu—Cu pads.

In yet another exemplary aspect, the present disclosure is directed to a semiconductor device. The semiconductor device includes a substrate, a deep trench capacitor (DTC) within the substrate, the DTC including first electrodes of positive polarity and second electrodes of negative polarity, an interconnect structure over the DTC and the substrate, the interconnect structure including conductive paths electrically couple the first and second electrodes to a top surface of the interconnect structure, the conductive paths being electrically isolated from each other within the interconnect structure, a first contact pad over the top surface of the interconnect structure, the first contact pad electrically connecting the first electrodes, and a second contact pad over the top surface of the interconnect structure, the second contact pad electrically connecting the second electrodes. In some embodiments, the first and second contact pads include aluminum alloy. In some embodiments, the semiconductor device further includes a first through substrate via (TSV) extending through the substrate, the first TSV electrically connecting to the first electrodes through the first contact pad, and a second TSV extending through the substrate, the second TSV electrically connecting to the second electrodes through the second contact pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a metal-insulator-metal (MIM) structure in a substrate, wherein the MIM structure includes a plurality of first electrodes of a first polarity and a plurality of second electrodes of a second polarity;

forming first and second through vias on opposing sides of the MIM structure, wherein bottom surfaces of the first and second through vias are below a bottommost surface of the MIM structure;

after the forming of the first and second through vias, forming an interconnect structure over the substrate, wherein the interconnect structure includes conductive paths electrically connecting to the first and second electrodes, wherein the conductive paths are isolated from each other inside the interconnect structure; and forming first and second contact pads over the interconnect structure, wherein the first contact pad electrically connects a first portion of the conductive paths corresponding to the first electrodes, and the second contact pad electrically connects a second portion of the conductive paths corresponding to the second electrodes.

2. The method of claim 1, wherein the MIM structure is a deep trench capacitor (DTC).

3. The method of claim 1, wherein the forming of the MIM structure includes:

etching the substrate to form at least first and second trenches;

depositing a stack of conductive layers and dielectric layers alternatively arranged in the first and second trenches; and patterning the stack to form the MIM structure.

4. The method of claim 3, wherein in a cross-sectional view the second contact pad extends in a way such that the second trench is fully under the second contact pad, and at least a center portion of the first trench is positioned directly under a gap between the first and second contact pads.

5. The method of claim 1, further comprising:

depositing first and second passivation layers over the interconnect structure, wherein each of the first and second contact pads includes a plurality of lower portions surrounded by the first passivation layer and an upper portion surrounded by the second passivation layer and contacting each of the lower portions.

6. The method of claim 5, wherein each of the lower portions electrically connects one of the conductive paths in the interconnect structure.

7. The method of claim 5, wherein the lower portions and the upper portion include different conductive materials.

8. The method of claim 7, wherein the upper portion includes aluminum.

9. The method of claim 1, wherein the first and second contact pads are aluminum-containing pads.

10. The method of claim 1, wherein after the forming of the first and second contact pads, the first contact pad electrically connects the first through via to the first electrodes, the second contact pad electrically connects the second through via to the second electrodes, and the first and second through vias remain electrically isolated from the first and second electrodes within the interconnect structure.

11. A method of manufacturing a capacitor, comprising:

forming a trench in a substrate;

depositing a stack of alternating metal layers and dielectric layers in the trench;

depositing a dielectric layer over the stack;

forming conductive vias extending through the dielectric layer and contacting the metal layers;

forming one or more metallization layers over the dielectric layer, wherein the conductive vias remain electrically isolated from each other through the metallization layers;

forming a first passivation layer over the metallization layers;

forming contact pads with lower portions embedded in the passivation layer, wherein each of the contact pads electrically connects two or more of the conductive vias; and forming a second passivation layer over the first passivation layer, wherein upper portions of the contact pads are surrounded by the second passivation layer.

12. The method of claim 11, wherein in a top view at least one of the contact pads includes a via pad connected to a trace, and the via pad has a width larger than the trace.

13. The method of claim 12, wherein the trace has a straight portion extending from the via pad and a bended portion connected to the straight portion.

14. The method of claim 11, wherein the contact pads include an aluminum alloy.

15. The method of claim 11, further comprising:

forming through substrate vias (TSVs) extending through the substrate, wherein the TSVs are electrically connected to the conductive vias through the contact pads.

16. The method of claim 15, further comprising:

forming backside contact pads on a backside surface of the substrate, wherein the backside contact pads are electrically connected to the conductive vias through the TSVs and the contact pads.

17. The method of claim 16, wherein the contact pads are Al—Cu pads, and the backside contact pads are NiPdAu—Cu pads.

18. A method, comprising:

etching a substrate to form at least first and second trenches;

depositing a stack of metal layers and dielectric layers alternatively arranged in the first and second trenches;

patterning the stack to form a deep trench capacitor (DTC) that includes a plurality of first electrodes of a first polarity and a plurality of second electrodes of a second polarity;

forming an interconnect structure over the substrate, wherein the interconnect structure includes conductive paths electrically connecting to the first and second electrodes, wherein the conductive paths are isolated from each other inside the interconnect structure;

forming first and second contact pads over the interconnect structure, wherein the first contact pad electrically connects a first portion of the conductive paths associated with the first electrodes, and the second contact pad electrically connects a second portion of the conductive paths associated with the second electrodes, wherein in a cross-sectional view the second contact pad extends in a way such that the second trench is fully under the second contact pad, and at least a center portion of the first trench is positioned directly under a gap between the first and second contact pads; and depositing first and second passivation layers over the interconnect structure, wherein each of the first and second contact pads includes a plurality of lower portions surrounded by the first passivation layer and an upper portion surrounded by the second passivation layer and contacting each of the lower portions.

19. The method of claim 18, wherein the first and second contact pads include aluminum alloy.

20. The method of claim 18, further comprising:

forming first and second through substrate vias (TSVs) extending through the substrate, wherein the first and second TSVs are electrically connected to the first and second contact pads, respectively; and forming first and second backside contact pads on a backside surface of the substrate, wherein the first and second backside contact pads are electrically connected to the first and second contact pads through the first and second TSVs, respectively.

* * * * *